United States Patent [19]
Liu et al.

[11] Patent Number: 6,037,216
[45] Date of Patent: Mar. 14, 2000

[54] METHOD FOR SIMULTANEOUSLY FABRICATING CAPACITOR STRUCTURES, FOR GIGA-BIT DRAM CELLS, AND PERIPHERAL INTERCONNECT STRUCTURES, USING A DUAL DAMASCENE PROCESS

[75] Inventors: Hao-Chieh Liu, Taipei; Fu-Liang Yang, Tainan; Wan-Yih Lien; Tzu-Shih Yen, both of Hsinchu, all of Taiwan

[73] Assignee: Vanguard International Semiconductor Corporation, Hsin-Chu, Taiwan

[21] Appl. No.: 09/184,342

[22] Filed: Nov. 2, 1998

[51] Int. Cl.[7] .................................................. H01L 21/8242
[52] U.S. Cl. ...................... 438/253; 438/250; 438/393; 438/398; 438/672
[58] Field of Search ..................................... 438/253, 393, 438/395, 398, 250

[56] References Cited

U.S. PATENT DOCUMENTS

| 5,497,017 | 3/1996 | Gonzales | 257/306 |
|---|---|---|---|
| 5,635,423 | 6/1997 | Huang et al. | 437/195 |
| 5,702,990 | 12/1997 | Jost et al. | 438/618 |
| 5,710,073 | 1/1998 | Jeng et al. | 438/239 |
| 5,731,236 | 3/1998 | Chou et al. | 438/253 |
| 5,879,986 | 3/1999 | Sung | 438/253 |

OTHER PUBLICATIONS

S. Nakamura, "A Simple 4 G–bit DRAM Technology Utilizing High–Aspect Ratio Pillars for Cell–Capacitors and Peripheral–Vias Simultaneously Fabricated", 1997 IEEE, IEDM '97, p29–32.

*Primary Examiner*—David Nelms
*Assistant Examiner*—Phuc Dang
*Attorney, Agent, or Firm*—George O. Saile; Stephen B. Ackerman

[57] ABSTRACT

A process for simultaneously forming storage node structures, for a DRAM cell, and an interconnect structure, for a peripheral region of a DRAM chip, has been developed. The process features the use of dual damascene procedures, with the first damascene procedure used to create the storage node, and interconnect structures, followed by a second damascene procedure, used to create plug structures, used to contact the underlying storage node and interconnect structures. This invention also features the use of SAC openings, allowing the formation of the SAC storage node structures to be realized.

24 Claims, 18 Drawing Sheets

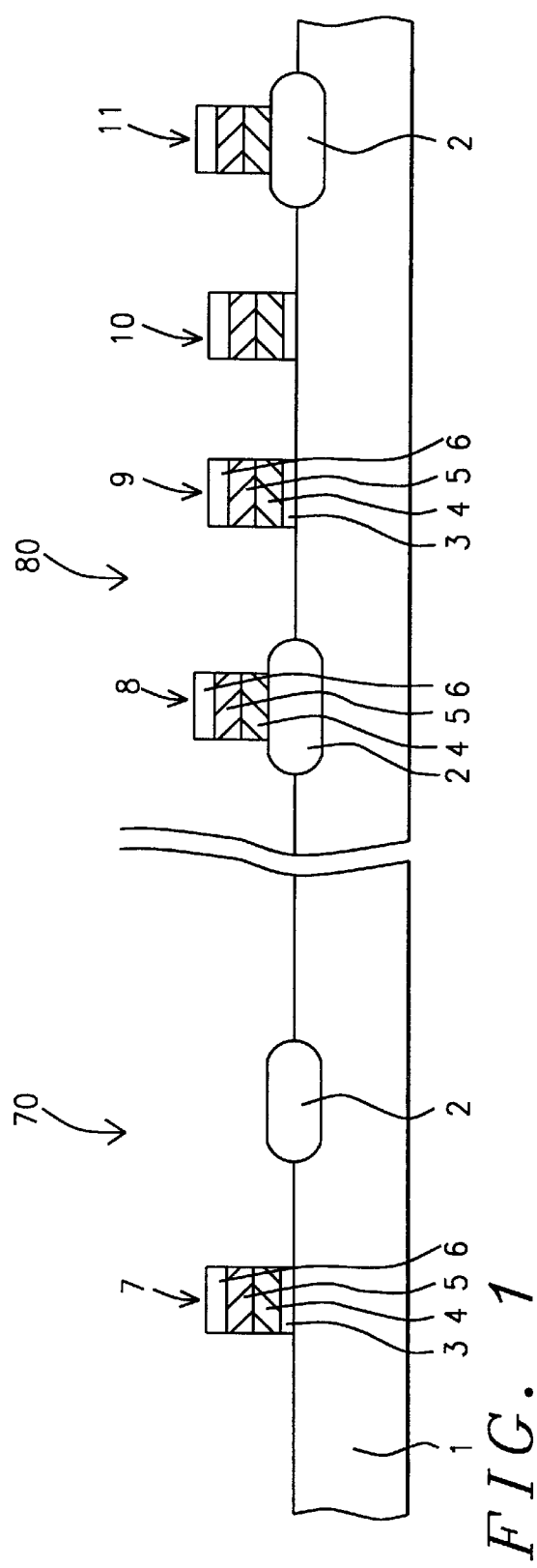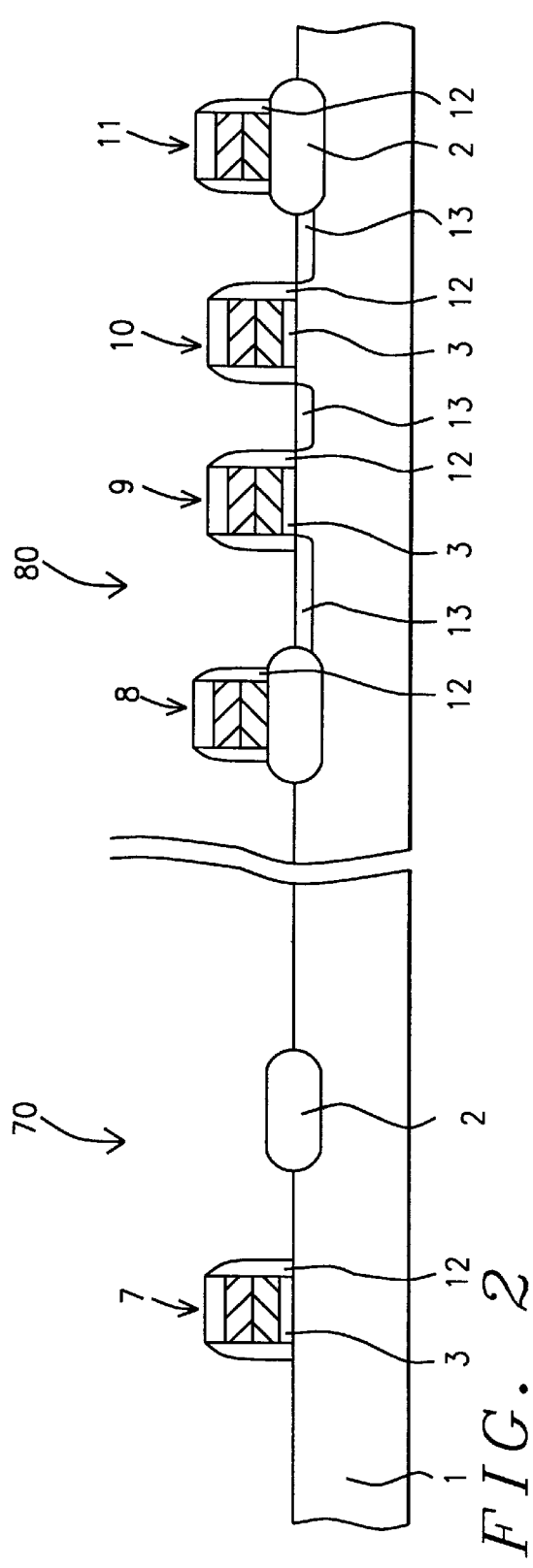

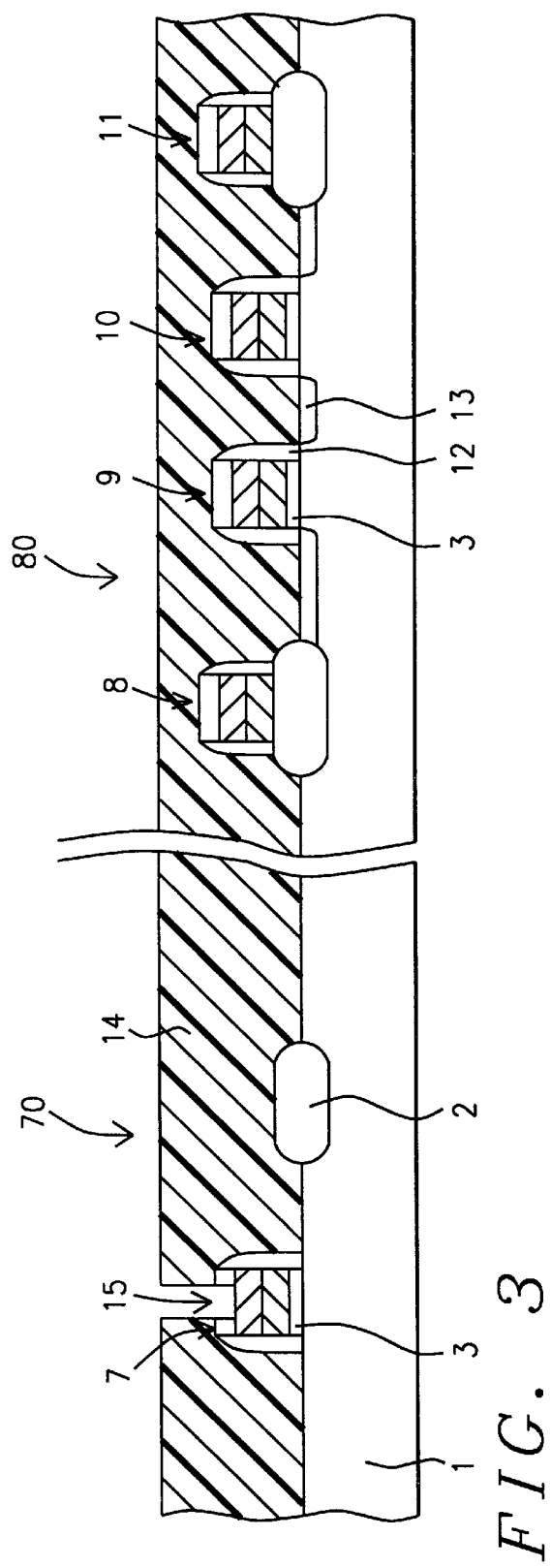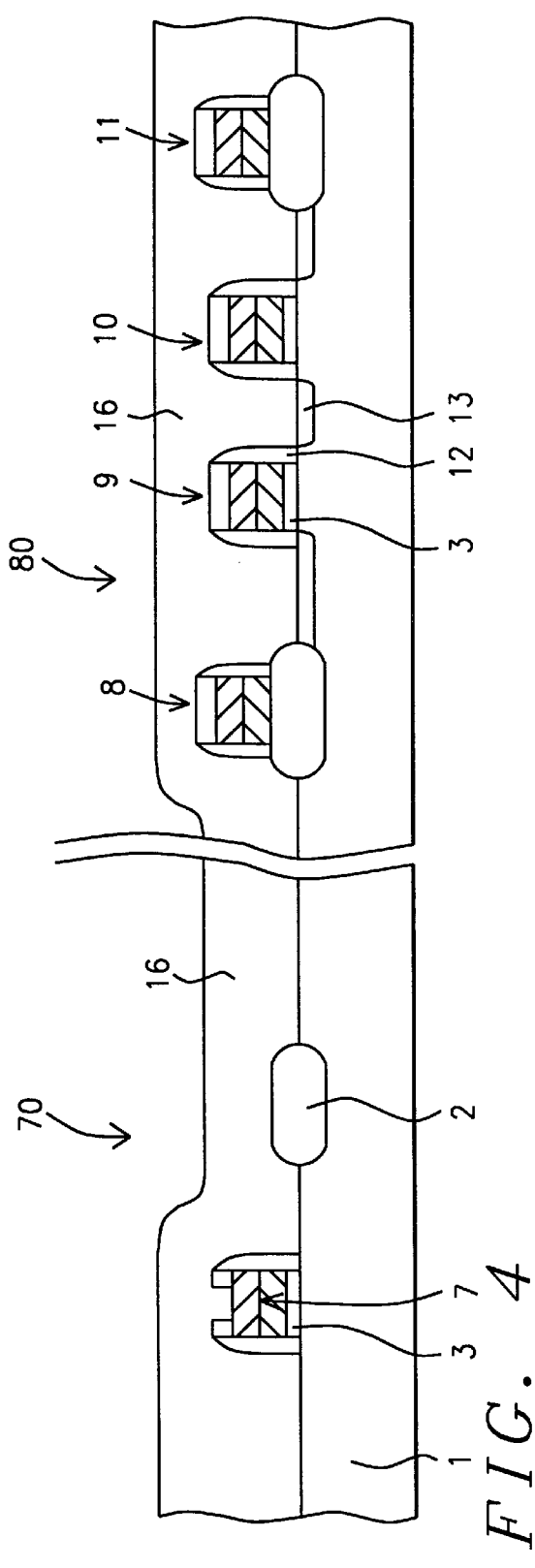

METHOD FOR SIMULTANEOUSLY FABRICATING CAPACITOR STRUCTURES, FOR GIGA-BIT DRAM CELLS, AND PERIPHERAL INTERCONNECT STRUCTURES, USING A DUAL DAMASCENE PROCESS

BACKGROUND OF THE INVENTION

(1) Field of the Invention

The present invention relates to methods used to fabricate dynamic random access memory, (DRAM), semiconductor devices, and more specifically to a method used to create contact structures to peripheral regions, while simultaneously forming the capacitor node structure, for a DRAM memory cell.

(2) Description of the Prior Art

As the density of DRAM chips increase to giga-bit levels, the area of the DRAM cell has to be decreased. The reduced area of the DRAM cell, is achieved using design rules of about 0.15 micrometers, or less. This aggressive design rule, places demands on the specific components of the DRAM cell, and of peripheral regions, of the DRAM chip. For example, in order to achieve desired performance, the capacitance of the DRAM device has to be maintained via the use of capacitor nodes, exhibiting a height of at least 1 micrometer. The thick insulator layers used to passivate the tall, capacitor structures, result in process complexities, when attempting to open contact holes to a lower feature of a DRAM capacitor structure. In addition the thick insulator layers also result in high aspect ratio contact, or via holes, used for communication between interconnect structures, and substrate components, in the peripheral region of the DRAM chip. This invention will describe a novel process utilizing a dual damascene procedure, in which the first damascene procedure, results in the simultaneous creation of the tall capacitor nodes, in the DRAM cell region, and a lower interconnect structure, in the peripheral region. A second damascene procedure allows the creation of metal filled, narrow via holes, to the DRAM capacitor structure, as well as to the lower interconnect structure, to be realized. Prior art, such as Chou et al, in U.S. Pat. No. 5,731,236, as well as Jeng et al, in U.S. Pat. No. 5,710,073, show combinations of capacitor structures, self-aligned contact, (SAC), structures, and interconnect structures, however none of these prior arts offer the dual damascene procedures, used in the present invention, featuring the simultaneous formation of the DRAM cell, capacitor node structures, and the interconnect structures, used in the peripheral region of the DRAM chip.

SUMMARY OF THE INVENTION

It is an object of this invention to simultaneously create the capacitor node structures for a high density DRAM cell, and the interconnect structures for peripheral devices.

It is another object of this invention to use a dual damascene procedure, to allow contact, and via holes, to be created in thick insulator layers, to be filled with high aspect ratio structures.

It is yet another object of this invention to pattern a silicon nitride layer, and to use the patterned silicon nitride layer, underlying a thick silicon oxide layer, as a stop layer, for a second damascene procedure, used to open contact holes to a peripheral word line structure, and to a region in the semiconductor substrate.

It is still another object of this invention to use two levels of self-aligned contact, (SAC), openings, to allow, tall, capacitor node structures to contact source/drain regions, in a semiconductor substrate.

In accordance with the present invention a method for simultaneously creating capacitor node structures, for a high density DRAM cell, and interconnect structures, in a peripheral region, featuring dual damascene procedures, and featuring the use of two levels of SAC openings, has been developed. A first level of polycide, (metal silicide—polysilicon), gate structures, capped with a silicon nitride layer, and with silicon nitride spacers, on the sides of the polycide gate structures, is formed in the DRAM cell regions, while a second silicon nitride capped, polycide gate structure, is formed in a peripheral region of a DRAM chip. After forming source/drain regions, in areas of the DRAM cell not covered by polycide gate structures, an opening in the capping silicon nitride layer, of the polycide gate structure, in the peripheral region, is made, exposing a portion of the top surface of a metal silicide layer. A first silicon oxide layer is deposited and patterned, forming first level, SAC openings, larger in width than the space between the silicon nitride capped, polycide gate structures, in the DRAM cell region, thus exposing source/drain regions, between silicon nitride capped, polycide gate structures, as well as exposing a portion of the top surface of the silicon nitride capped, polycide gate structures. The patterning procedure is also used to open a contact hole in the first silicon oxide layer, exposing a first region of the semiconductor substrate, in the peripheral region. Conductive plugs, are then formed in the SAC openings, creating SAC structures, while a conductive plug structure is also formed in the contact hole, in the peripheral region.

A second silicon oxide layer is deposited and patterned, to open a bit line contact hole, in the second silicon oxide layer, exposing a SAC structure, in the DRAM cell region, to be used for a subsequent bit line contact structure, and to open a contact hole in the second silicon oxide layer, to expose the conductive plug structure, in the peripheral region. A second level of silicon nitride capped, polycide structures are formed, in the DRAM region, with the underlying polysilicon component, of one of the second level, silicon nitride capped, polycide gate structures, contacting the SAC structure, in the bit line contact hole, while the underlying polysilicon component, of another second level, silicon nitride capped, polycide gate structure, contacts the conductive plug structure, in the peripheral region. Silicon nitride spacers are formed on the sides of the second level, silicon nitride capped, polycide gate structures. A third silicon oxide layer, and an overlying silicon nitride layer are deposited, followed by the patterning of the silicon nitride layer, creating a silicon nitride hard mask. Openings in the silicon nitride hard mask, in the DRAM cell region, expose the top surface of the third silicon oxide layer, in regions directly overlying the space between second level, silicon nitride capped, polycide gate structures, and therefore directly overlying the SAC structures, located between first level, silicon nitride capped, polycide gate structures, that will be used for capacitor node contact. Additional openings in the silicon nitride hard mask, directly overlay the opening in the silicon nitride layer, of the silicon nitride capped, polycide gate structure, in the peripheral region, and directly overlay a second region of the semiconductor substrate, in the peripheral region.

A fourth silicon oxide layer is deposited and patterned to create second level SAC openings, in the fourth silicon oxide layer, and in the region of third silicon oxide layer, exposed in the opening in the silicon nitride hard mask, with the second level SAC openings, exposing the SAC structures, used for capacitor node contacts, in the DRAM cell region. The patterning of the fourth silicon oxide layer, and of the third silicon oxide layer, of the second silicon oxide layer, and of the first silicon oxide layer, exposed in opening in silicon nitride hard mask, result in the exposure of the polycide gate structure, and of the second region of the semiconductor substrate, located in the peripheral region. A tungsten layer is deposited, and subjected to a chemical mechanical polishing procedure, (CMP), removing tungsten from the top surface of the fourth silicon oxide layer, creating the damascene, capacitor node structures, in the opening in the fourth silicon oxide, and in the second level SAC openings, overlying and contacting the SAC structures, used for capacitor node contact, located in the first level of SAC openings. The CMP procedure also results in a damascene, lower interconnect structure, in the peripheral region, contacting the metal silicide layer, of the polycide gate structure, and contacting the second region of the semiconductor substrate. The exposed regions of the fourth silicon oxide layer are selectively removed, stopping on the underlying silicon nitride hard mask, resulting in capacitor node structures, as well as the lower interconnect structure, extending upwards from the silicon nitride hard mask.

Capacitor dielectric layers, and a capacitor cell plate structure, are formed on the capacitor node structures, creating the DRAM capacitor structure. A fifth silicon oxide layer is deposited, planarized using a CMP procedure, and patterned to open via holes to the top surface of the capacitor cell plate structure, in the DRAM cell, and to the damascene, lower interconnect structure, and a metal silicide layer, of a second level, silicon nitride capped, polycide gate structure, which contacts the conductive plug structure, in the peripheral region. A layer of tungsten is next deposited followed by a CMP procedure, creating damascene upper plugs structures, contacting the capacitor cell plate, in the DRAM cell, and the lower interconnect structure, and the second level, silicon nitride capped, polycide gate structure, in the peripheral region. Upper interconnect structures are then formed, overlying and contacting the upper, damascene plug structures.

BRIEF DESCRIPTION OF THE DRAWINGS

The object and other advantages of this invention are best described in the preferred embodiments with reference to the attached drawings that include:

FIGS. 1–20, which schematically, in cross-sectional style, show the key stages of fabrication used to simultaneously create capacitor nodes, for a DRAM cell, and interconnect structures for components located in a peripheral region of a DRAM chip.

DESCRIPTION OF THE PREFERRED EMBODIMENTS

Figure 5:
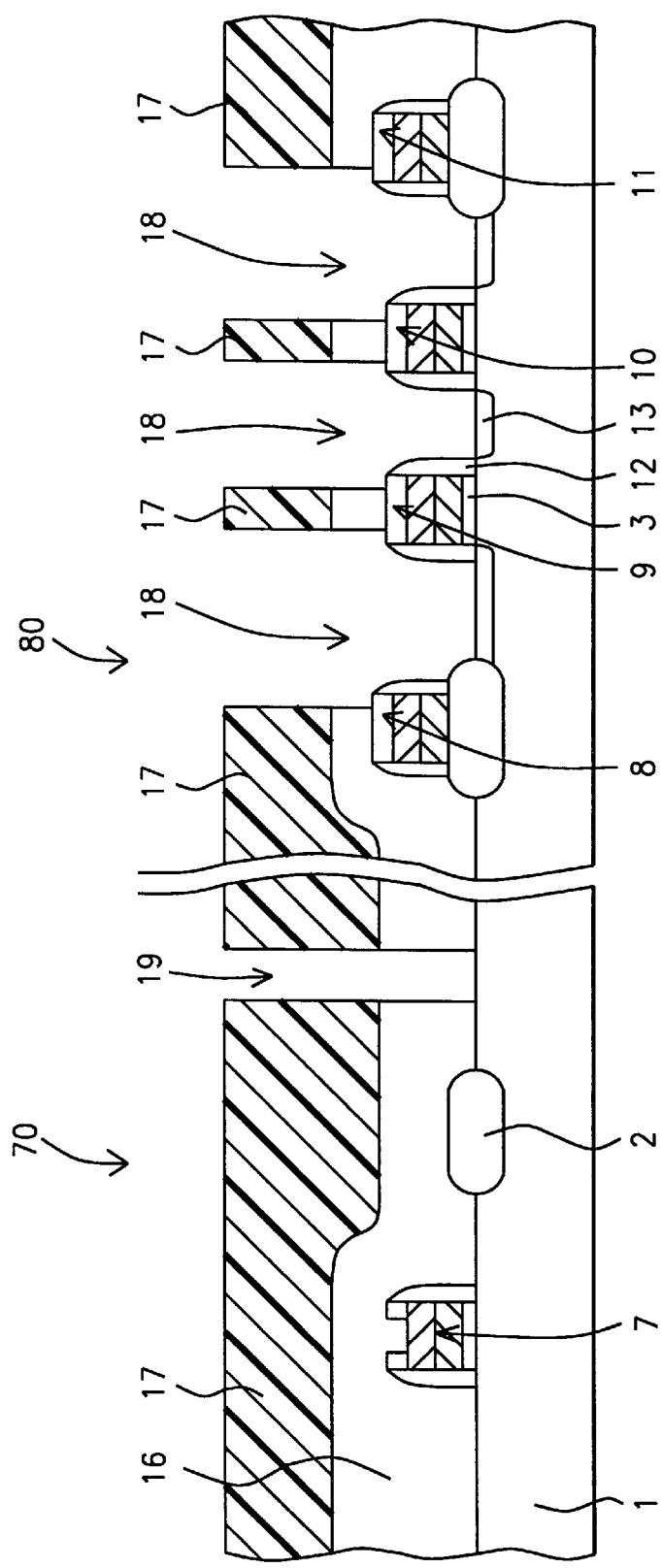

The method of simultaneously forming capacitor node structures, for a DRAM cell, and an interconnect structure on a peripheral region of the DRAM chip, also featuring the use of dual damascene procedures, will now be described in detail. A semiconductor substrate 1, comprised of single crystalline silicon, with a <100> crystallographic orientation, is used and schematically shown in FIG. 1. A region 80, of semiconductor substrate 1, will be used for illustration of a high density DRAM cell, while region 70, will be used to describe the fabrication of peripheral component, of a DRAM chip. Field oxide, (FOX), regions 2, will be used for isolation purposes. Briefly FOX regions 2, are formed via thermal oxidation of regions of semiconductor substrate 1, not covered by a composite insulator pattern, comprised of an overlying, oxidation resistant, silicon nitride layer, and an underlying silicon oxide layer. After formation of FOX regions 2, at a thickness between about 3000 to 5000 Angstroms, via a thermal oxidation procedure, performed in an oxygen—steam ambient, the composite insulator pattern is removed, followed by the growth of a silicon dioxide, gate insulator layer 3, at a thickness between about 50 to 200 Angstroms, via thermal oxidation procedures, performed in a oxygen—steam ambient. A polysilicon layer 4, is next deposited, using low pressure chemical vapor deposition, (LPCVD), procedures, to a thickness between about 500 to 1500 Angstroms. Polysilicon layer 4, can be doped in situ, during deposition, via the addition of arsine, or phosphine, to a silane ambient, or polysilicon layer 4, can be deposited intrinsically, and doped via ion implantation of arsenic or phosphorous ions. A metal silicide layer 5, such as tungsten silicide, is next deposited, via LPCVD, procedures, to a thickness between about 500 to 1500 Angstroms. Finally a silicon nitride layer 6, is deposited via LPCVD or plasma enhanced chemical vapor deposition, to a thickness between about 1000 to 2500 Angstroms. Conventional photolithographic and anisotropic, reactive ion etching, (RIE), procedures, using $CF_4$ an etchant for silicon nitride layer 6, and using $Cl_2$ as an etchant for metal silicide layer 5, and for polysilicon layer 4, are used to create silicon nitride capped, polycide, (metal silicide polysilicon), gate structure 7, in peripheral region 70, while creating silicon nitride capped, polycide gate structures 8–11, in DRAM cell region 80. The result of these procedures are schematically shown in FIG. 1, after removal of the photoresist mask, used to pattern the silicon nitride capped, polycide gate structures.

Silicon nitride insulator spacers 12, are formed on the sides of the silicon nitride capped, polycide gate structures, via a deposition of a silicon nitride layer, using an LPCVD or a PECVD procedure, to a thickness between about 200 to 1000 Angstroms, followed by an anisotropic RIE procedure, performed using $CHF_3$ as an etchant. A photoresist blockout mask is next used to allow source/drain regions 13, to be formed in DRAM cell region 80, in a region of semiconductor substrate 1, not covered by silicon nitride capped, polycide gate structures 8–11. Source/drain regions 13, shown schematically in FIG. 2, are formed via an ion implantation procedure, using arsenic or phosphorous ions performed at an energy between about 30 to 50 KeV, at a dose between about 1E14 to 1E16 atoms/cm². (Previously lightly doped source/drain regions, were created after definition of polycide gate structures 7–11, prior to formation of insulator spacers 12. The lightly doped source/drain region, not shown in the drawings, were created via ion implantation of arsenic or phosphorous, at an energy between about 10 to 40 KeV, at a dose between about 1E12 to 1E14 atoms/cm²). The photoresist blockout mask, used to create source/drain regions 13, in DRAM cell region 80, is removed via plasma oxygen ashing and careful wet clean procedures. Another photoresist shape 14, with opening 15, is then used as a mask, to allow a region of silicon nitride layer 6, of silicon nitride capped, polycide gate structure 7, in peripheral region 70, to be removed via an anisotropic RIE procedure, using $CHF_3$ as an etchant, exposing a portion of the top surface of metal silicide layer 5, in silicon nitride capped, polycide gate structure 7. This is schematically shown in FIG. 3. Photoresist shape 14, is removed using plasma oxygen ashing and careful wet cleans.

Figure 6:
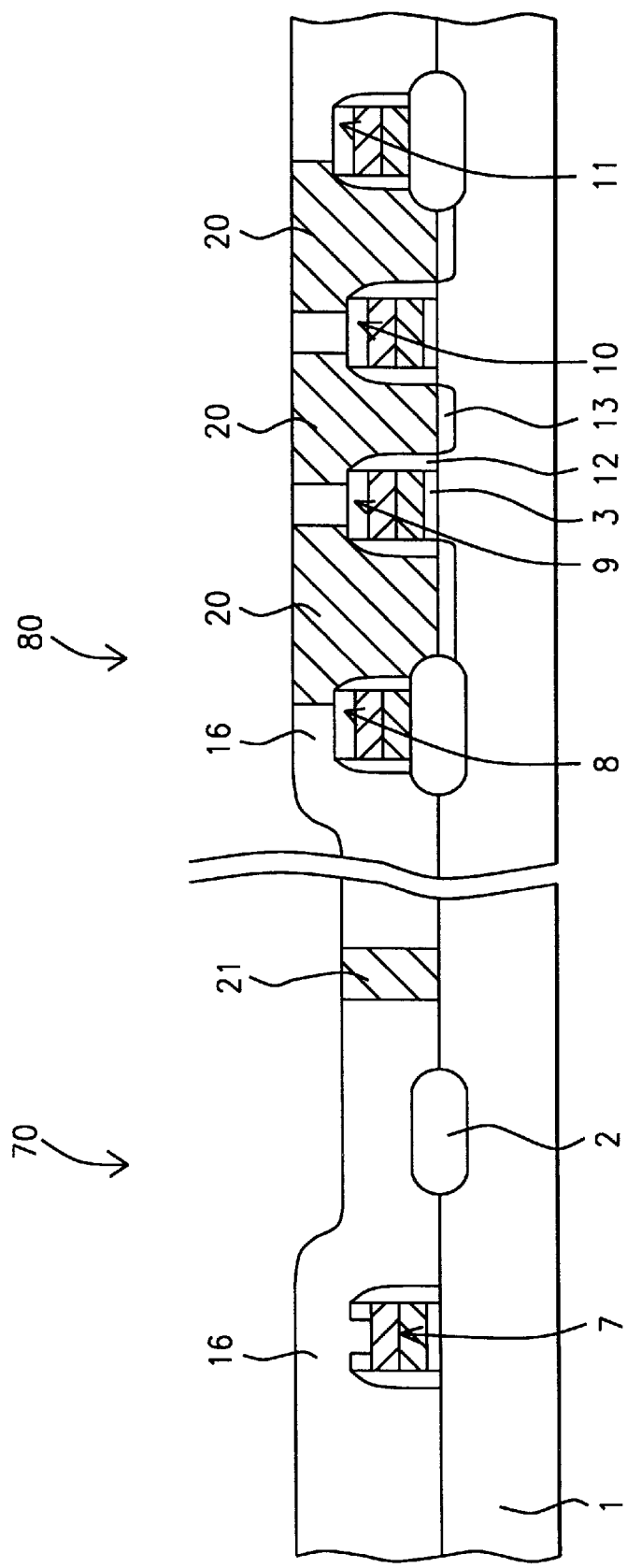

A silicon oxide layer 16, shown schematically in FIG. 4, is next deposited, to a thickness between about 5000 to 10000 Angstroms, via LPCVD or PECVD procedures. Photoresist shape 17, is then used to create a first level of self-aligned contact, (SAC), openings 18, in DRAM cell region 80. SAC openings 18, schematically shown in FIG. 5, and created via an anisotropic RIE procedure, using $CHF_3$ as an etchant, have a width larger than the spaces between silicon nitride capped, polycide gate structures 8–11. Therefore the selective RIE procedure, using $CHF_3$ as an etchant, did not attack silicon nitride layer 6, or silicon nitride spacers 12, during the SAC opening procedure, thus exposing not only the source/drain regions 13, located between silicon nitride capped, polycide gate structures, but also exposing a portion of the top surface of silicon nitride layer 6, used as the capping layer for the polycide gate structures. The use of the SAC opening, designed larger in width than the spaces between polycide gate structures, allow these spaces to be maintained at a narrower dimension then the minimum design rule, since a subsequent SAC structure, will be self-aligned to, and thus fully landed in, SAC openings 18. The same anisotropic RIE procedure, is also used to create opening 19, in silicon oxide layer 16, in peripheral region 70. After removal of photoresist shape 18, via plasma oxygen ashing and careful wet cleans, SAC structures 20, are formed in SAC openings 18, in the DRAM cell region 80, while conductive plug structure 21, is formed in opening 19, in peripheral region 70. The SAC structures 20, and contact plug 21, are formed via deposition of a polysilicon layer, in situ doped during deposition, via the addition of arsine or phosphine, to a silane ambient, followed by a selective RIE procedure, using $Cl_2$ as an etchant, removing polysilicon from the top surface of silicon oxide layer 16, forming SAC structures 20, and conductive plug structure 21. A tungsten layer, following a titanium nitride layer, can be used in place of polysilicon, for the SAC, and contact plug, structures. In addition, a chemical mechanical polishing, (CMP), procedure, can be used in place of the selective RIE procedure, to remove unwanted polysilicon or tungsten, from the top surface of silicon oxide layer 16. This is schematically shown in FIG. 6.

Figure 7:
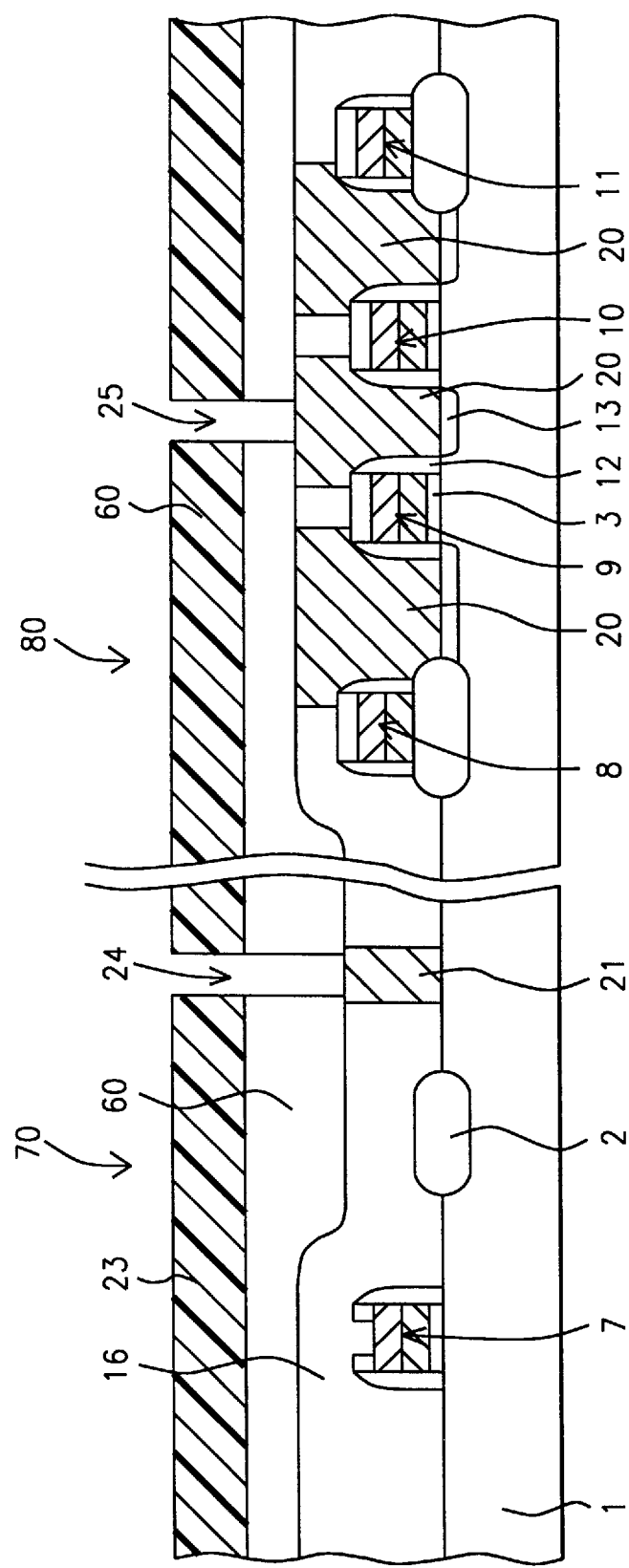
Figure 8:
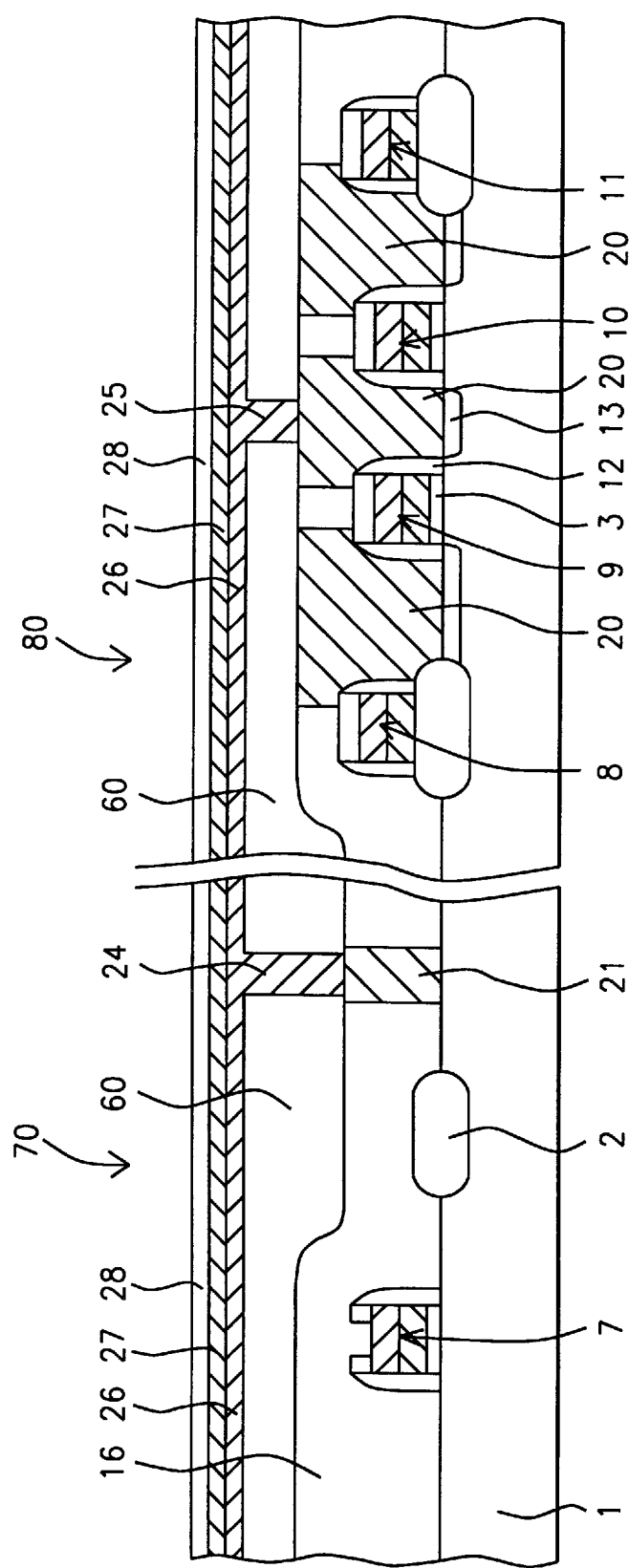
Figure 9:
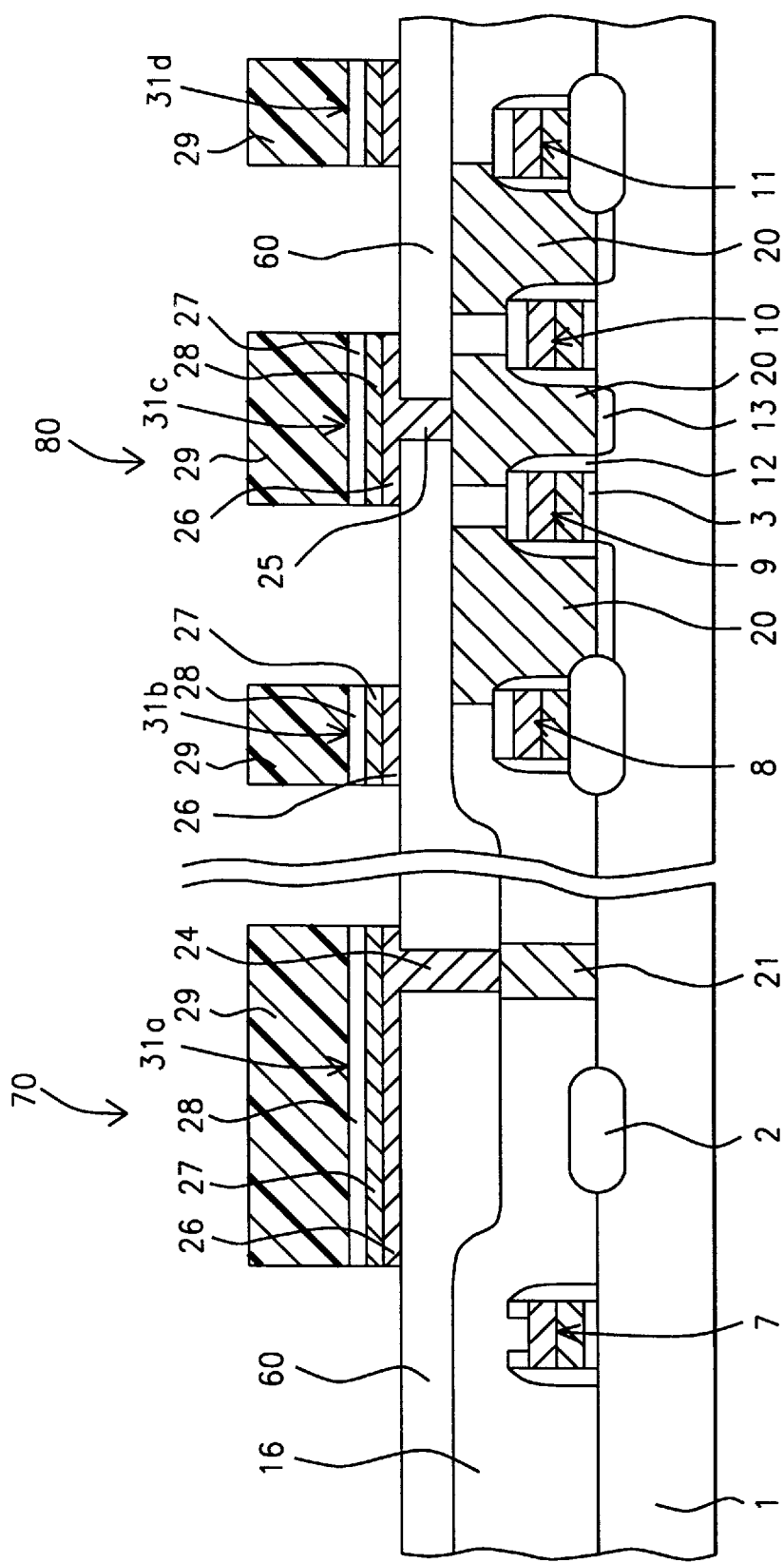

A silicon oxide layer 60, is deposited via LPCVD or PECVD procedures, to a thickness between about 2000 to 6000 Angstroms, followed by a CMP procedure, used to create a smooth top surface topography for silicon oxide layer 60. Photoresist shape 23, is then used as a mask, allowing an anisotropic RIE procedure, using $CHF_3$ as an etchant, to create opening 25, exposing the top surface of SAC structure 20, to be used as a contact pad for a subsequent bit line structure, in DRAM cell region 80, while also creating opening 24, exposing the top surface of conductive plug structure 21, in peripheral region 70. This is schematically illustrated in FIG. 7. After removal of photoresist shape 23, via plasma oxygen ashing and careful wet cleans, a polysilicon layer 26, a metal silicide layer 27, and a silicon nitride layer 28, are deposited. Polysilicon layer 26, is deposited via LPCVD procedures, to a thickness between about 500 to 1500 Angstroms, completely filling opening 25, as well as completely filling opening 24. Polysilicon layer 26, can be doped, in situ during deposition, via the addition of arsine, or phosphine, to a silane ambient, or polysilicon layer 26, can be deposited intrinsically, and doped via ion implantation procedures, using arsenic or phosphorous ions. Metal silicide layer 27, can be a tungsten silicide layer, or a titanium silicide layer, and is deposited using LPCVD procedures, to a thickness between about 500 to 1500 Angstroms, while silicon nitride layer 28, is deposited using LPCVD or PECVD procedures, to a thickness between about 1000 to 2500 Angstroms. The result of these depositions are schematically shown in FIG. 8. Photoresist shape 29, is used as a mask, to pattern the series of layers, creating a silicon nitride capped, polycide structure 31c, connected to SAC structure 20, that will be used as part of a subsequent bit line structure, via polysilicon filled, opening 25. The patterning, accomplished via an anisotropic RIE procedure, using $CF_4$ as an etchant for silicon nitride layer 28, and using $Cl_2$ as an etchant for metal silicide layer 27, and polysilicon layer 26, also creates a silicon nitride capped, polycide structure 31a, connected to conductive plug 21, via polysilicon filled opening 24. In addition silicon nitride capped, polycide structures 31b, and 31d, are formed on silicon oxide layer 60, directly overlying silicon nitride capped, polycide gate structure 8, and silicon nitride capped, polycide gate structure 11. This is schematically shown in FIG. 9.

Figure 10:
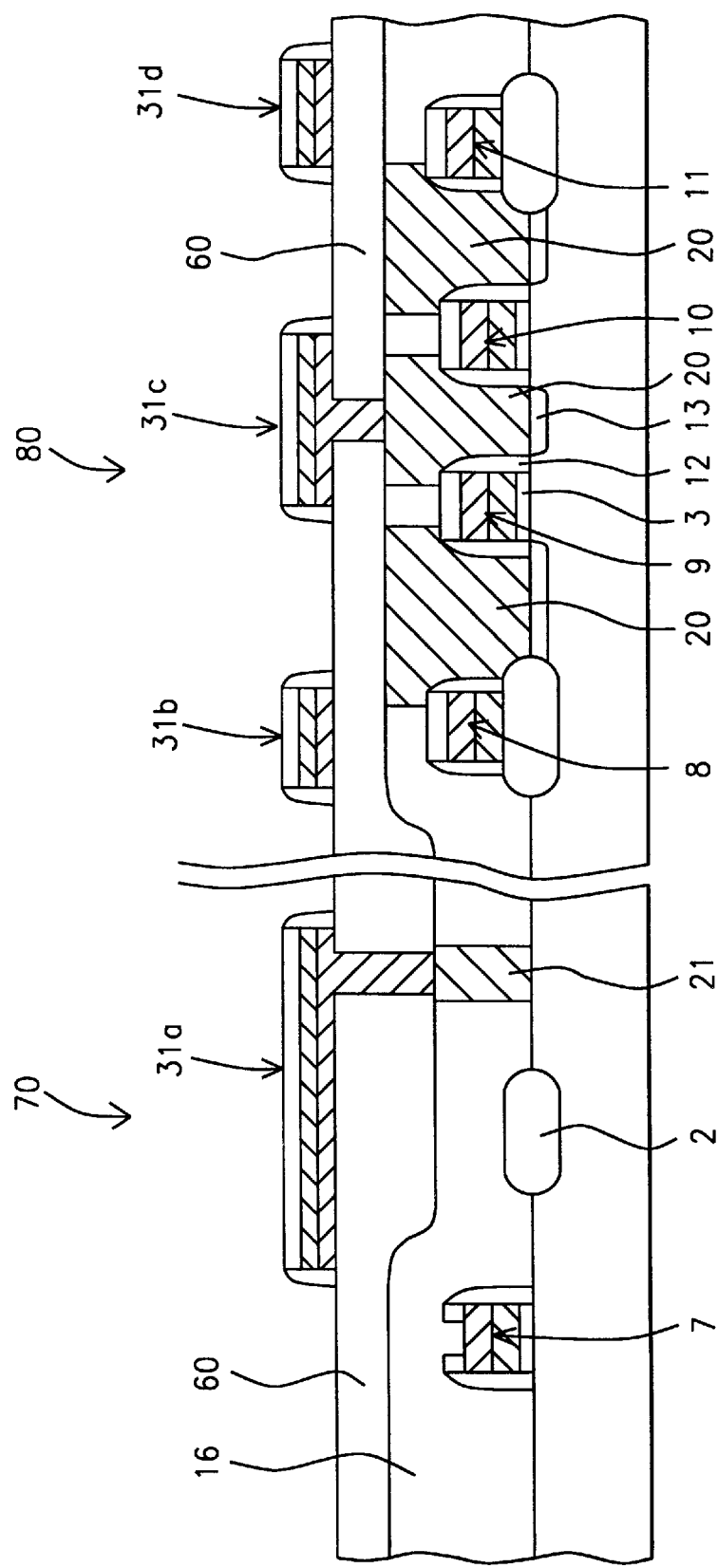
Figure 11:
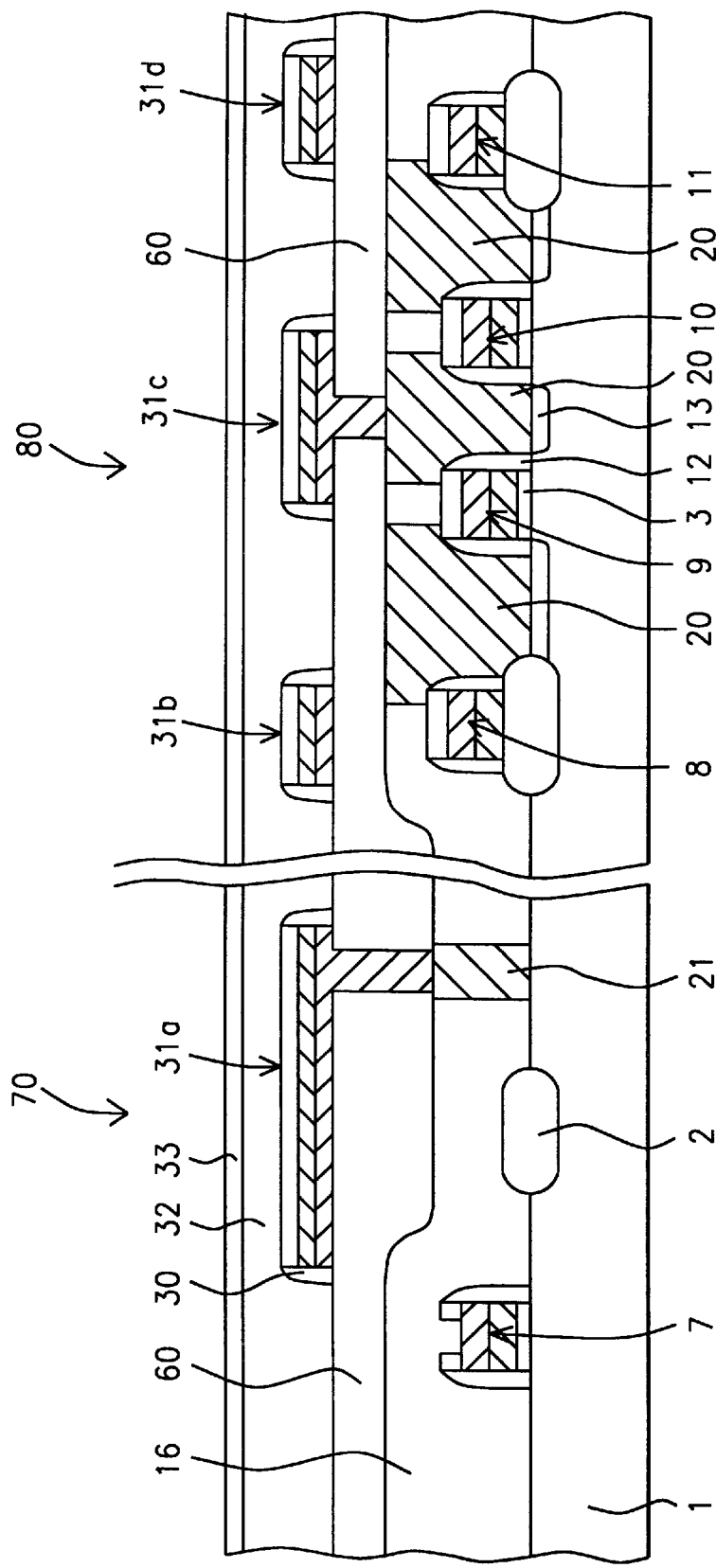
Figure 12:
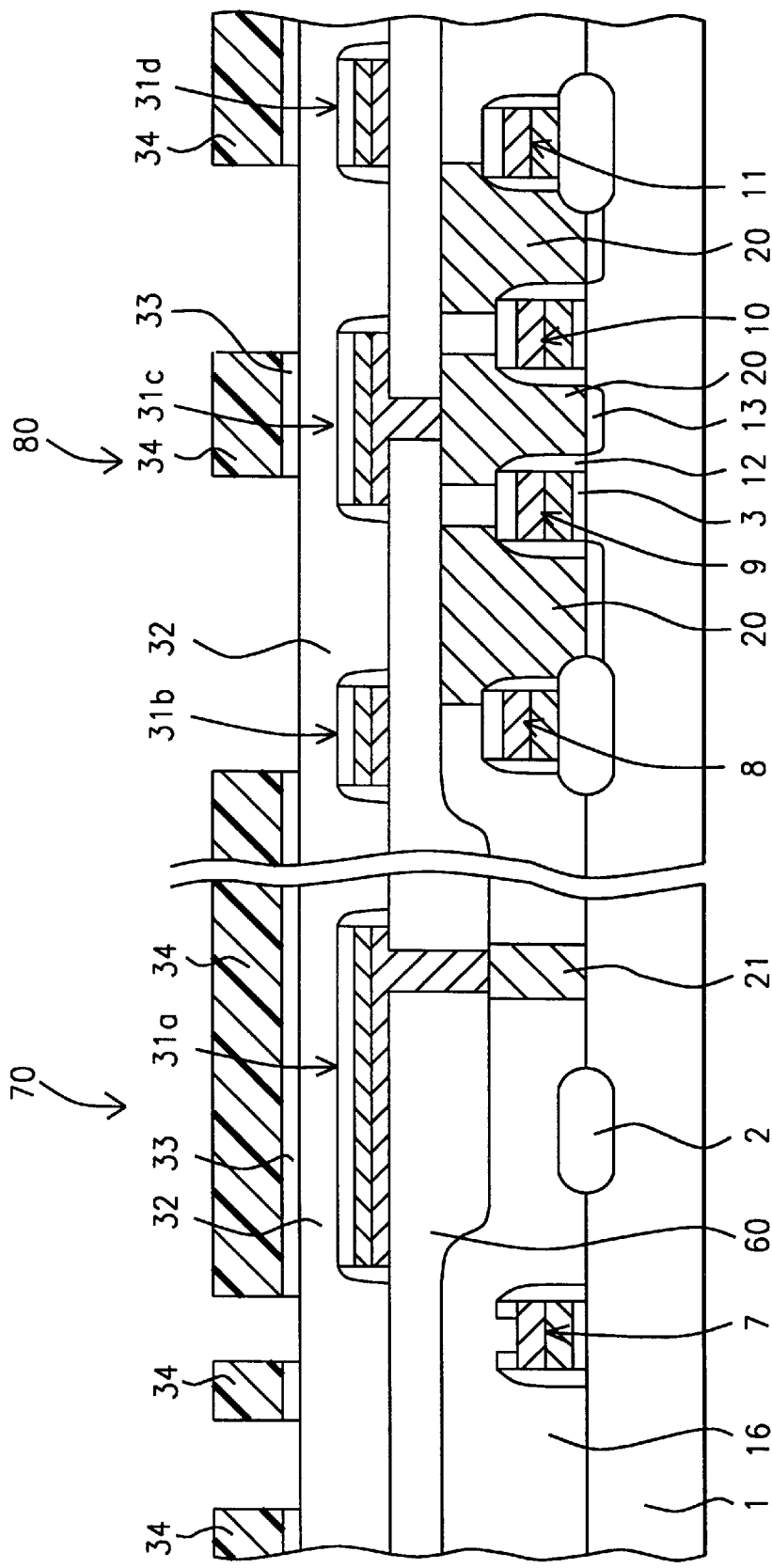
Figure 13:
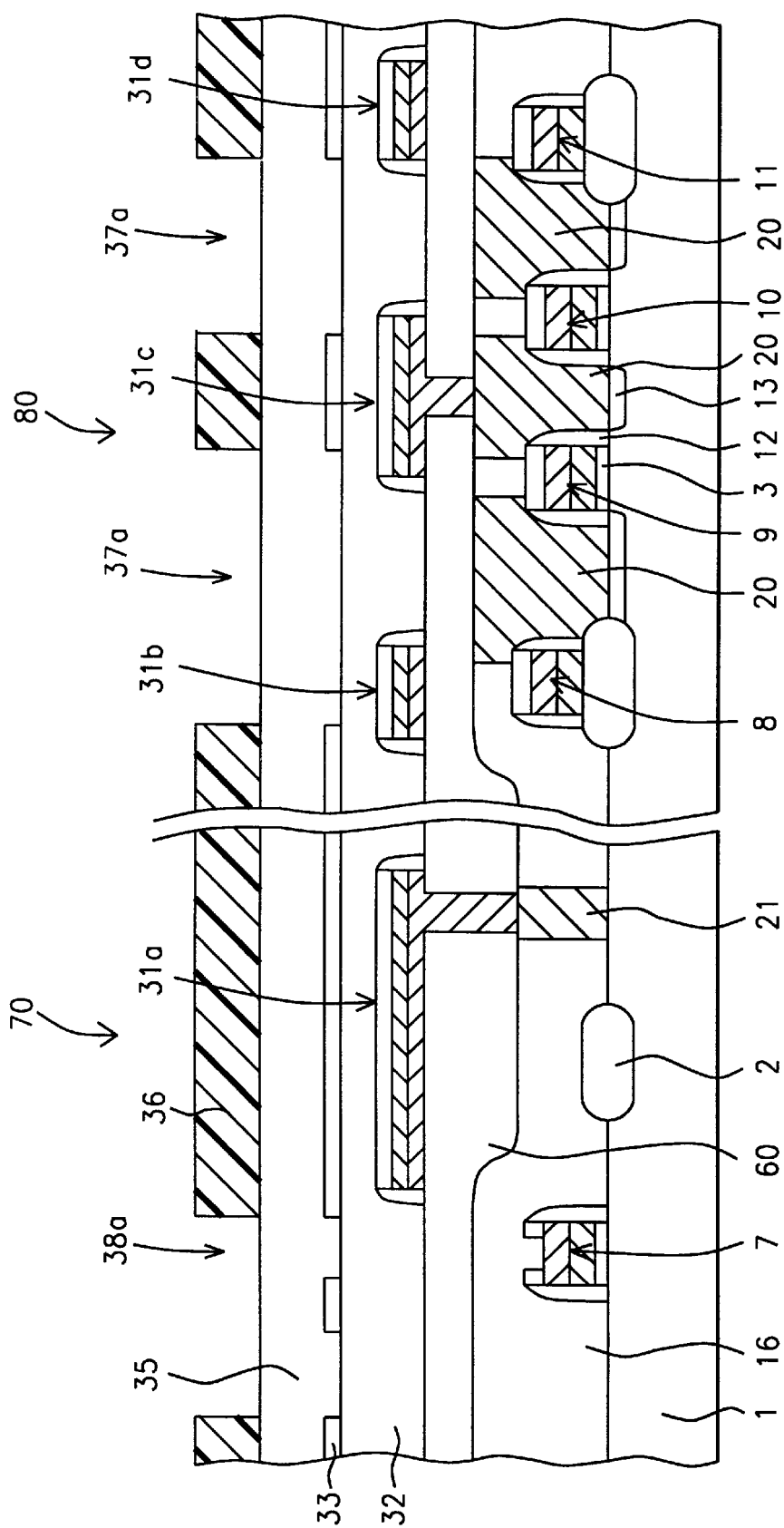

Silicon nitride spacers 30, are next formed on the sides of all silicon nitride capped, polycide structures, via deposition of a silicon nitride layer, using LPCVD or PECVD procedures, to a thickness between about 200 to 1000 Angstroms, followed by an anisotropic RIE procedure, using $CHF_3$ as an etchant. The result of these procedures is schematically shown in FIG. 10. Silicon oxide layer 32, is deposited via LPCVD or PECVD procedures, to a thickness between about 4000 to 10000 Angstroms. After a CMP procedure, resulting in a smooth top surface topography for silicon oxide layer 32, a silicon nitride layer 33, shown schematically in FIG. 11, is deposited using LPCVD or PECVD procedures, to a thickness between about 100 to 1000 Angstroms. Photoresist shape 34, is then formed and used as an etch mask, allowing an anisotropic RIE procedure, using $CHF_3$ as an etchant, to form a hard mask pattern in silicon nitride layer 33, shown schematically in FIG. 12. After removal of photoresist shape 34, via plasma oxygen ashing and careful wet cleans, silicon oxide layer 35, is deposited, using LPCVD or PECVD procedures, to a thickness between about 4000 to 15000 Angstroms. Another photoresist shape 36, is formed, exhibiting openings 37a, lining up with the openings in the underlying hard mask pattern in silicon nitride layer 33, and exhibiting opening 38a, overlying openings in the underlying hard mask pattern in silicon nitride layer 33, where the openings in the hard mask pattern in silicon nitride are aligned to the opening in silicon nitride layer 6, of silicon nitride capped, polycide gate structure 7. This is schematically shown in FIG. 13.

Figure 14:
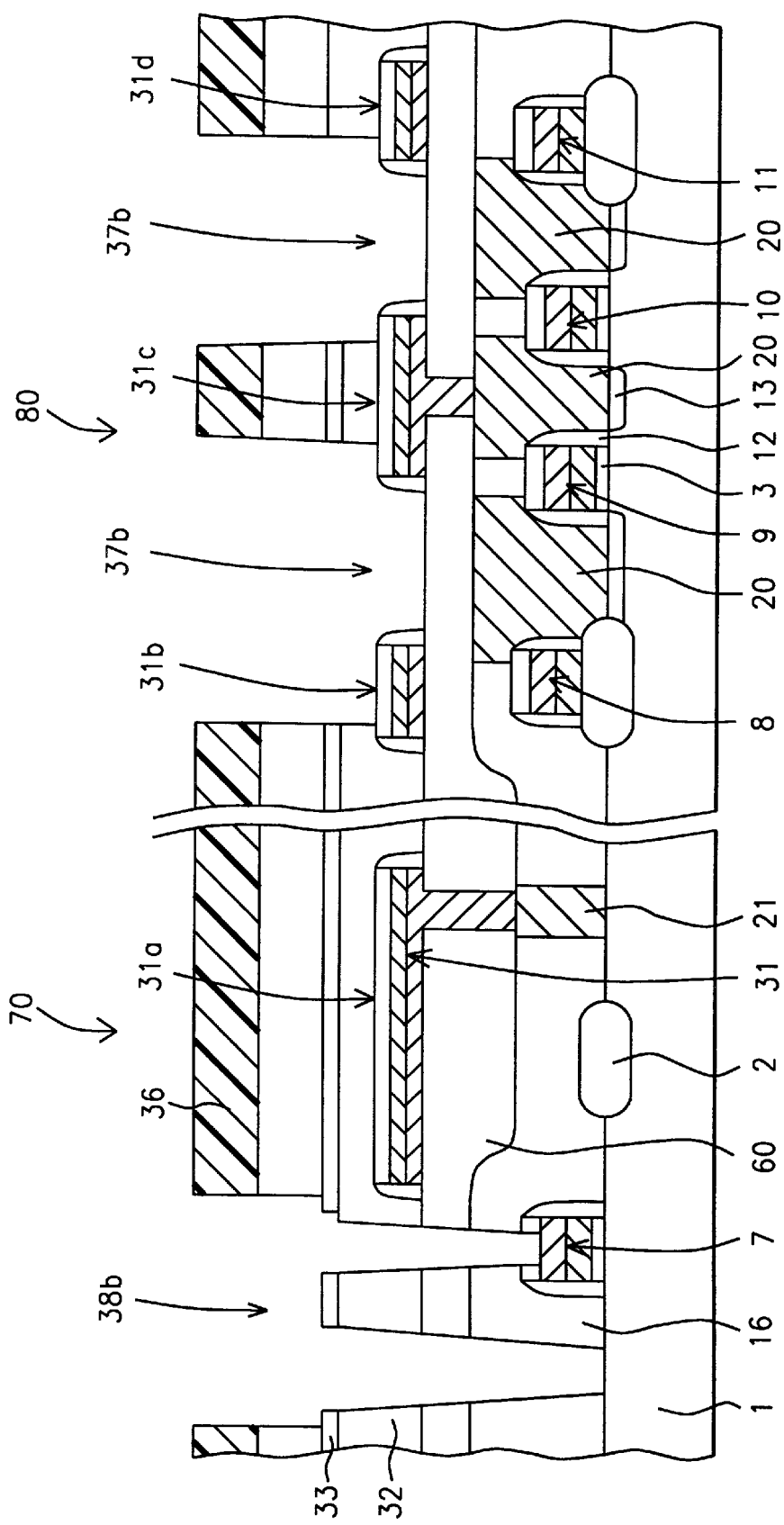

An anisotropic RIE procedure, using $CHF_3$ as an etchant, using photoresist shape 36, as a mask, is used to form openings 37b, in silicon oxide layer 35, and in silicon oxide layer 32, exposed in the hard mask pattern in silicon nitride layer 33. Openings 37b, are larger in width than the spaces between silicon nitride capped, polycide structures 31b, 31c, and 31d, and in addition to exposing the spaces between silicon nitride capped, polycide structures, expose the capping silicon nitride layer, and the silicon nitride spacers, of the silicon nitride capped, polycide structures, and therefore will function as second level of SAC openings. The anisotropic RIE procedure, using $CHF_3$ as an etchant, also creates opening 38b, using photoresist shape 36, as well as the hard mask pattern in silicon nitride layer 33, as a mask, via removal of silicon oxide layer 35, silicon oxide layer 32, silicon oxide layer 60, and silicon oxide layer 16. Opening 38b, exposes the metal silicide layer, in silicon nitride capped, polycide gate structure 7, as well as exposing a portion of semiconductor substrate 1. This is schematically shown in FIG. 14.

Figure 15:
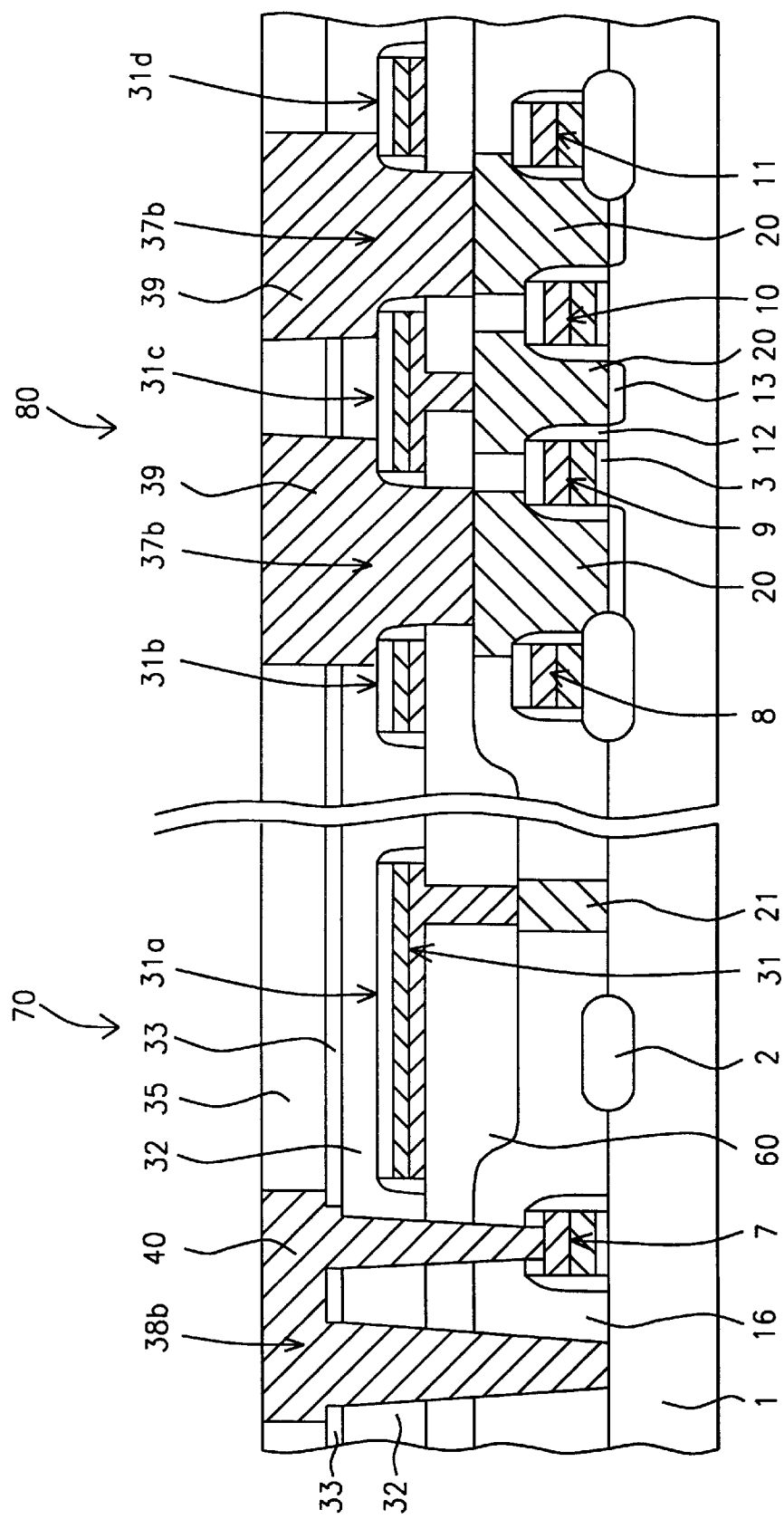
Figure 16:
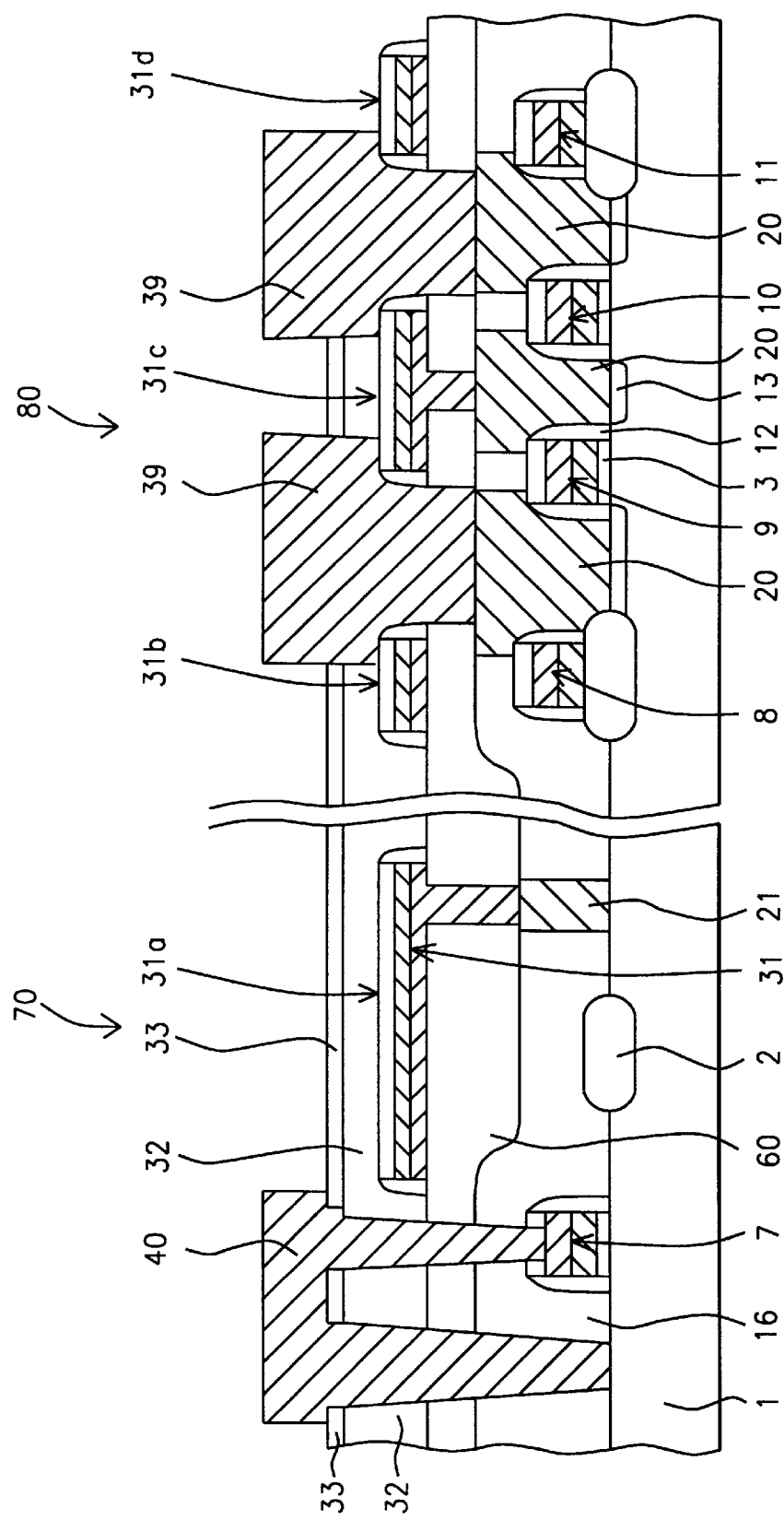

After removal of photoresist shape 36, via plasma oxygen ashing and careful wet cleans, a tungsten layer is deposited, using R.F. sputtering, or LPCVD procedures, to a thickness between about 4000 to 12000 Angstroms, completely filling openings 37b, and opening 38b. A CMP procedure is next employed to remove tungsten from the top surface of silicon oxide layer 35, creating a series of first damascene type structures, including self-aligned, storage node structures 39, in openings 37b. In addition a damascene type, lower interconnect structure 40, is created in opening 38b. This is schematically illustrated in FIG. 15. A wet etch procedure, using a dilute, or buffered hydrofluoric acid solution, is used to selectively remove silicon oxide 35, resulting in storage node structures 39, extending upwards from silicon nitride layer 33, presenting the additional surface area, now available for the desired capacitance increase. In addition, lower interconnect structure, shown schematically in FIG. 16, also extends upward from silicon nitride layer 33.

Figure 17:
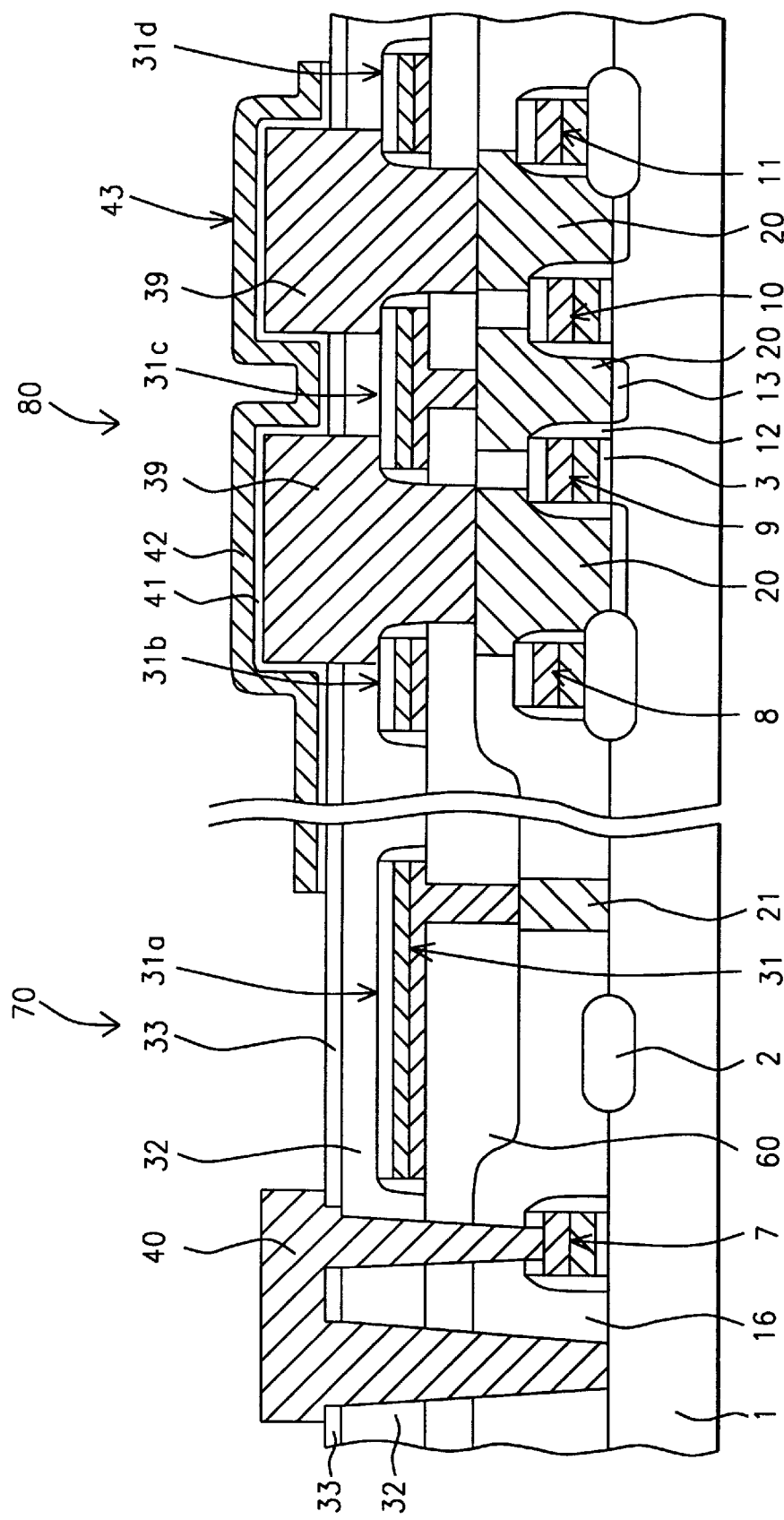

FIG. 17, schematically illustrates the completion of the DRAM capacitor structure 43, in DRAM cell region 80. First a capacitor dielectric layer 41, comprised of either a $Ta_2O_5$ layer, a ON, (oxidized nitride), layer, a BST, (barium strontium titanate), layer, or a PZT, (lead zirconate titanate), layer, is deposited using LPCVD procedures, to a silicon oxide equivalent thickness between about 30 to 80 Angstroms. A polysilicon layer 42, is next deposited using LPCVD procedures, to a thickness between about 500 to 2000 Angstroms, and doped either in situ, during deposition, or deposited intrinsically and doped via an ion implantation procedure, using arsenic or phosphorous ions. A tungsten layer can be used in place of polysilicon layer 42, if desired. Photolithographic and RIE procedures, using $Cl_2$ as an etchant for polysilicon layer 42, and using $CHF_3$ as an etchant for capacitor dielectric layer 41, are used to create the cell plate structure, for DRAM capacitor structure 43, schematically shown in FIG. 17. The photoresist shape, used as the etch mask for cell plate patterning, is removed using plasma oxygen ashing and careful wet cleans.

Figure 18:
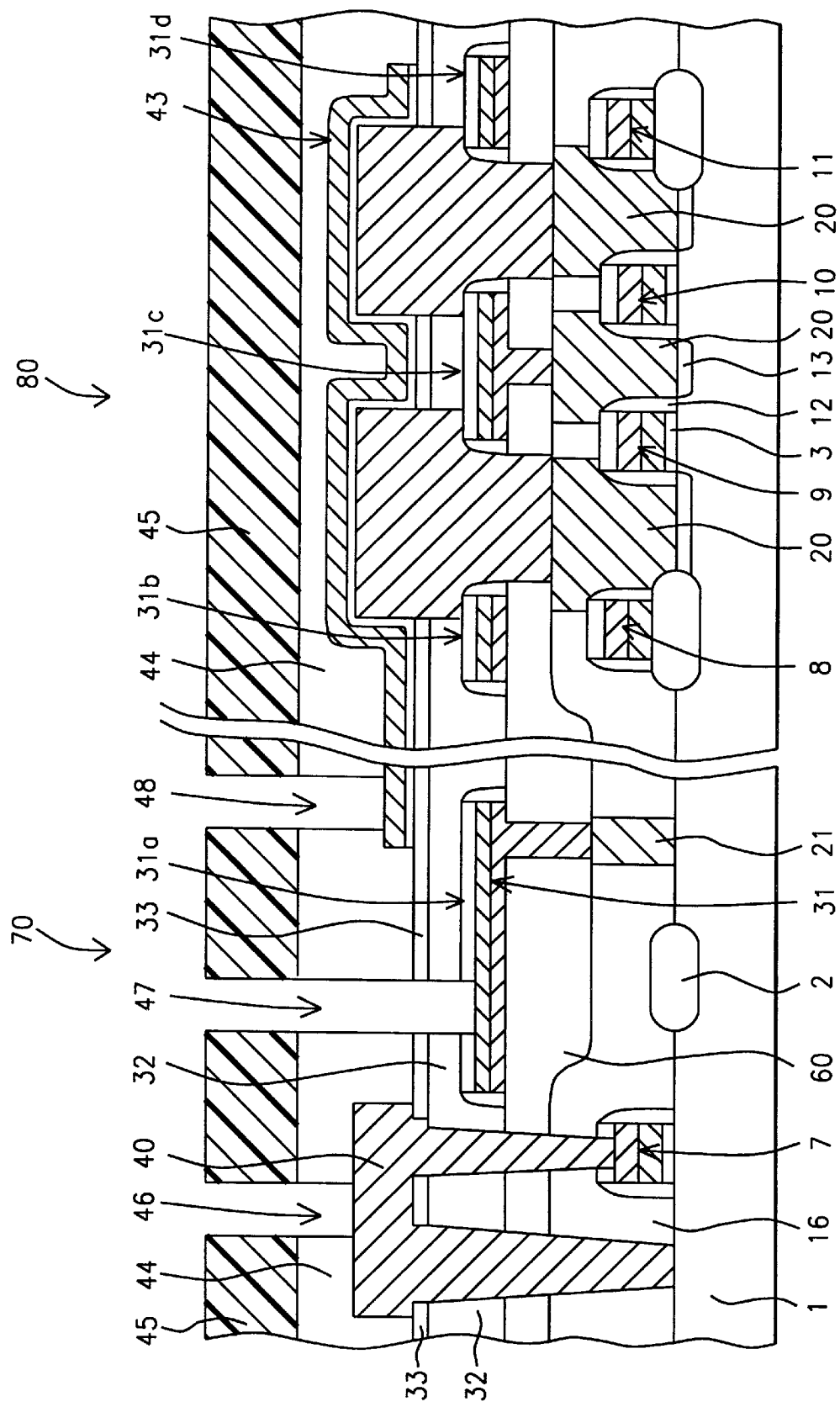
Figure 19:
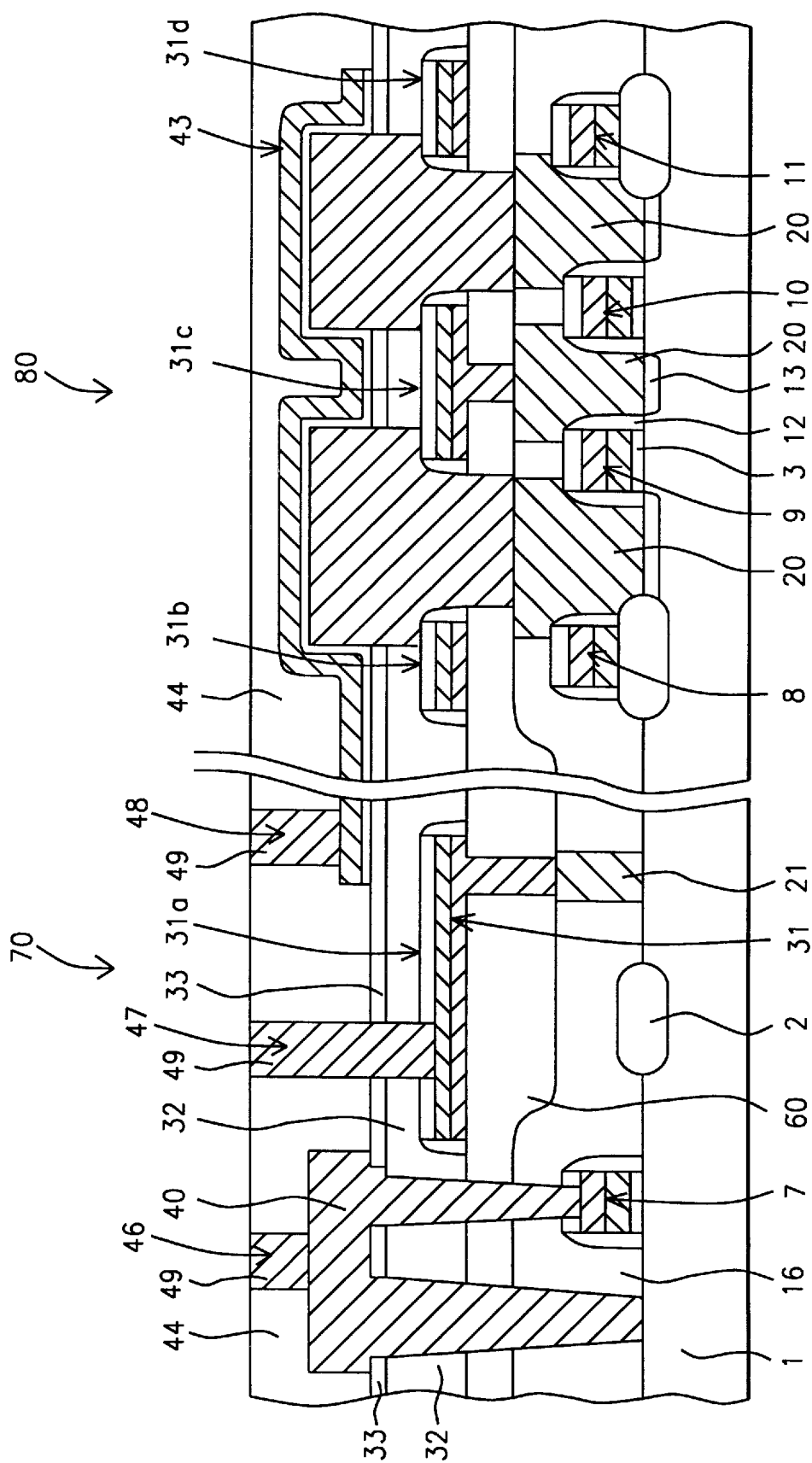

A silicon oxide layer 44, is next deposited, via LPCVD or PECVD procedures, to a thickness between about 4000 to 12000 Angstroms. A CMP procedure is again employed to planarize the topography of silicon oxide layer 44. A photoresist shape 45, schematically shown in FIG. 18, is formed and used as a mask, allowing an anisotropic RIE procedure, to create the desired openings to specific components in DRAM region 80, as well as in peripheral region 70. The anisotropic RIE procedure, using $CHF_3$ as an etchant for silicon oxide layer 44, results in opening 46, exposing the top surface of lower interconnect structure 40, and results in opening 48, exposing the top surface of DRAM capacitor structure 43. Photoresist shape 45, is also used as a mask to create opening 47, in silicon oxide layer 44, in silicon nitride layer 33, in silicon oxide layer 32, and in the silicon nitride layer, of silicon nitride capped, polycide structure 31a, exposing the metal silicide layer of silicon nitride capped, polycide structure 31a. This is accomplished using $CHF_3$ as an etchant for the silicon oxide layers, and using $CHF_3$ as an etchant for the silicon nitride layers. After removal of photoresist shape 45, via plasma oxygen ashing and careful wet cleans, a second damascene procedure is used to create tungsten plugs, in openings 46, 47, and 48, shown schematically in FIG. 19. This is accomplished via a tungsten deposition, using LPCVD or R.F. sputtering procedures, at a thickness between about 4000 to 10000 Angstroms, followed by removal of unwanted tungsten from the top surface of silicon oxide layer 44, via a CMP procedure, or a selective, anisotropic RIE procedure, using $Cl_2$ as an etchant, creating: tungsten plug 49, in opening 46, contacting lower interconnect structure 40; tungsten plug 49, in opening 48, contacting DRAM capacitor structure 43; and tungsten plug 49, in opening 47, contacting silicon nitride capped, polycide structure 31a.

Figure 20:
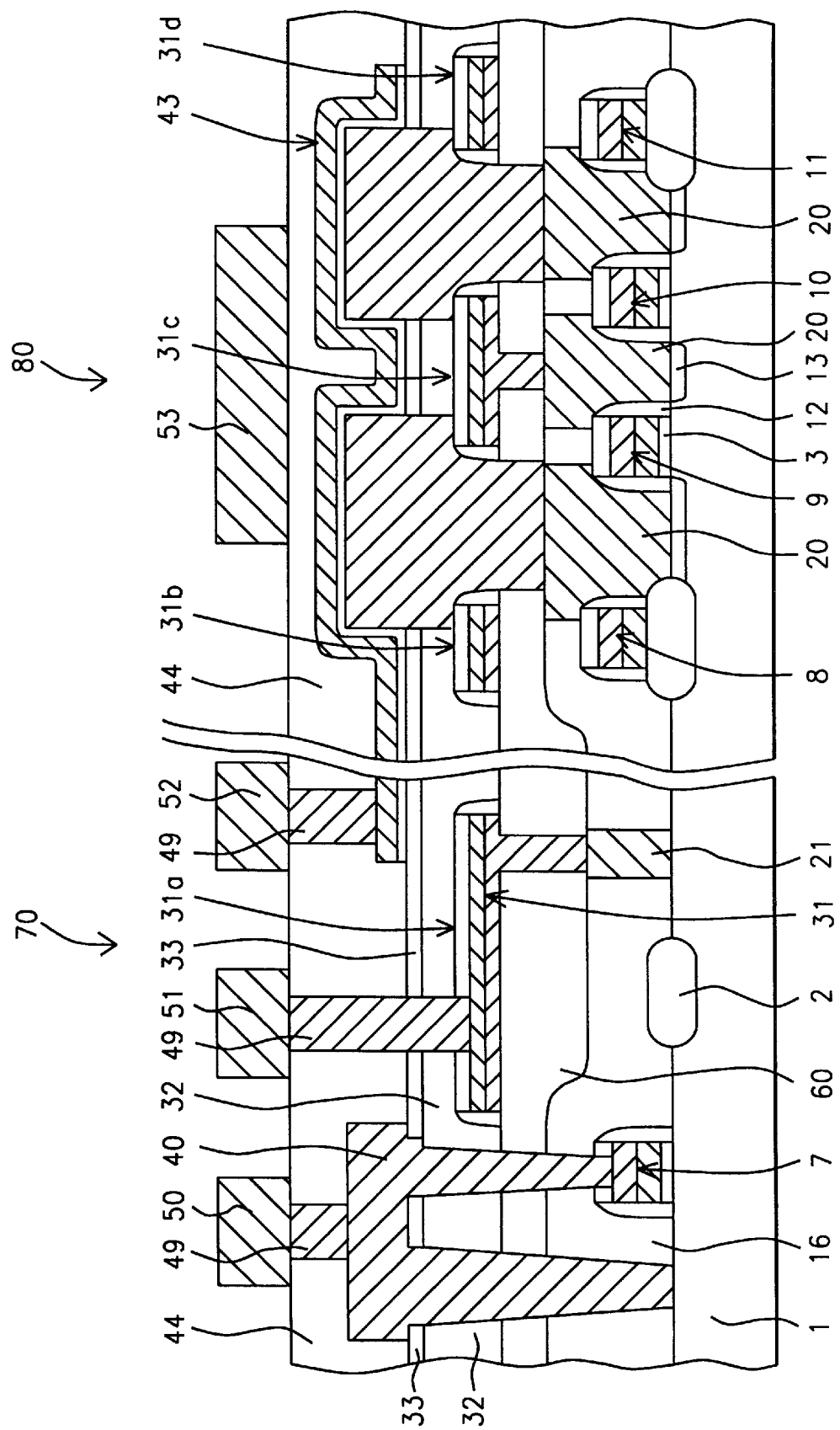

Finally upper interconnect structures, schematically shown in FIG. 20, are created via deposition of an aluminum based metal layer, followed by patterning procedures, comprised of conventional photolithographic and anisotropic RIE procedures, using $Cl_2$ as an etchant. The aluminum based metal layer, is comprised of an aluminum layer, containing between about 1 to 3 weight % copper, obtained via R.F. sputtering procedures, at a thickness between about 3000 to 10000 Angstroms. The patterning procedure results in the formation: of upper interconnect structure 54, connected to lower interconnect structure 40, via tungsten plug 49; of upper interconnect structure 51, connected to a region of semiconductor substrate 1, via tungsten plug 49, silicon nitride capped, polycide structure 31a, and conductive plug structure 21; of upper interconnect structure 52, connected to DRAM capacitor structure 43, via tungsten plug 40; and upper interconnect structure 53, which is used for communication with bit line structures, (not shown in the drawings). The photoresist shape, used as a mask for patterning of the aluminum based layer, is removed using plasma oxygen ashing and careful wet cleans.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a dynamic random access memory, (DRAM), device on a semiconductor substrate, comprising the steps of:

forming a first level of polycide gate structures, in a first region of said semiconductor substrates, with the polycide gate structures capped with a silicon nitride layer, with silicon nitride spacers on the sides of the polycide gate structures, and with source/drain regions, in said semiconductor substrate, located between polycide gate structures;

forming a polycide gate structure, in a second region of said semiconductor substrate, capped with a silicon nitride layer, and with silicon nitride spacers on the sides of said polycide gate structure, with a opening in silicon nitride layer, exposing a portion of the top surface of a metal silicide layer, of said polycide gate structure, in said second region of said semiconductor substrate;

forming a first level of self-aligned contact, (SAC), openings, in a first silicon oxide layer, in said first region of said semiconductor substrate, exposing said source/drain, located between polycide gate structures, and exposing a portion of the capping silicon nitride layer, located on said first level of polycide gate structures;

forming a contact hole in said first silicon oxide layer, exposing a first portion of said semiconductor substrate, in a second region of said semiconductor substrate;

forming SAC structures, in said first level of SAC openings;

forming a conductive plug structure in said contact hole, in said first silicon oxide layer, located in second region of said semiconductor substrate;

forming a second level of polycide structures, capped with a silicon nitride layer, and with silicon nitride spacers on the sides of said level of polycide structures, on a second silicon oxide layer, with a first polycide gate structure, of said second level of polycide structures, connected to an underlying SAC structure that is used as a bit line contact structure, located in said first region of said semiconductor substrate, via a first opening in said second silicon oxide layer, and with a second polycide gate structure, of said second level of polycide structures, connected to said conductive plug structure, in said second region of said semiconductor substrate, via a second opening in said second silicon oxide layer;

forming a silicon nitride masking pattern, on a third silicon oxide layer, with a first set of openings, in said silicon nitride masking pattern, located in said first region of said semiconductor substrate, while a second set of openings, in said silicon nitride masking pattern, is located in said second region of said semiconductor substrate;

depositing a fourth silicon oxide layer;

forming a second level of SAC openings, in said first region of said semiconductor substrate, with said second level of SAC openings created in said fourth silicon oxide layer, using an opening in a overlying photoresist shape as a mask, and in said third silicon oxide layer, and in said second silicon oxide layer, exposed in said first set of openings in said silicon nitride masking pattern, and with said second level of SAC openings located between polycide structures, of said second level of polycide structures, exposing the top surface of SAC structures, in said first level of SAC openings, to be used as storage node SAC structures;

forming a lower interconnect opening, in said second region of said semiconductor substrate, with said lower interconnect opening created in said fourth silicon oxide layer, using an opening in an overlying photoresist shape as a mask, and in said third silicon oxide layer, in said second silicon oxide layer, and in said first silicon oxide layer, using said second set of openings in said silicon nitride masking pattern as a mask, exposing a second portion of said semiconductor substrate, in said second region of said semiconductor substrate, and exposing the metal silicide layer, of said polycide gate structure, located in said second region of said semiconductor substrate;

forming storage node capacitor structures, in said second level of SAC openings;

forming a lower interconnect structure, in said lower interconnect opening;

selectively removing said fourth silicon oxide layer, from the top surface of said silicon nitride masking pattern;

forming a capacitor structure, comprised of a cell plate structure, a capacitor dielectric layer, and said storage node capacitor structures, in said first region of said semiconductor substrate;

forming metal plug structures, in a openings in a fifth silicon oxide layer, with a first metal plug structure contacting said capacitor structure, with a second metal plug contacting said lower interconnect structure, and with a third metal plug connected to said conductive plug structure, via said second polycide structure, of said second level of polycide structures; and forming upper interconnect structures, with a first upper interconnect structure connected to said capacitor structure, via said first metal plug structure, with a second upper interconnect structure connected to said lower interconnect structure, via said second metal plug structure, and with said third upper interconnect structure connected to said second polycide structure, of said second level of polycide structures, via a third metal plug structure.

2. The method of claim 1, wherein said polycide gate structures, of said first level of polycide gate structures, are comprised of an overlying silicon nitride, capping layer, obtained using LPCVD or PECVD procedures, at a thickness between about 1000 to 2500 Angstroms, a metal silicide layer, such as tungsten silicide, obtained via LPCVD deposition, at a thickness between about 500 to 1500 Angstroms, and an underlying polysilicon layer, obtained using LPCVD procedures, at a thickness between about 500 to 1500 Angstroms, with the polysilicon layer doped in situ, during deposition, via the addition of arsine or phosphine, to a silane ambient, or with the polysilicon layer deposited intrinsically and doped via ion implantation of arsenic or phosphorous ions.

3. The method of claim 1, wherein said silicon nitride spacers, on the sides of the polycide gate structures, of said first level of polycide gate structures, are formed via deposition of a silicon nitride layer, using LPCVD or PECVD procedures, at a thickness between about 200 to 1000 Angstroms, followed by an anisotropic RIE procedure, using $CF_4$ as an etchant.

4. The method of claim 1, wherein said first silicon oxide layer is deposited using LPCVD or PECVD procedures, to a thickness between about 5000 to 10000 Angstroms.

5. The method of claim 1, wherein said first level of SAC openings, are formed in said first silicon oxide layer, via an anisotropic RIE procedure, using $CHF_3$ as an etchant.

6. The method of claim 1, wherein said SAC structures, formed in said first level of SAC openings, are comprised of either a doped polysilicon layer, or a tungsten layer, obtained via LPCVD procedures, to a thickness between about 3000 to 6000 Angstroms.

7. The method of claim 1, wherein said second level of polycide structures are comprised of an overlying capping layer of silicon nitride, obtained via LPCVD or PECVD procedures, at a thickness between about 1000 to 2500 Angstroms, and an underlying polycide layer, comprised of a tungsten silicide layer, obtained using LPCVD procedures, at a thickness between about 500 to 1500 Angstroms, on an underlying doped polysilicon layer, obtained using LPCVD procedures, at a thickness between about 500 to 1500 Angstroms.

8. The method of claim 1, wherein said silicon nitride spacers, on the sides of said second level of polycide structures, are formed via deposition of a silicon nitride layer, via LPCVD or PECVD procedures, at a thickness between about 200 to 1000 Angstroms, followed by an anisotropic RIE procedure, using $CHF_3$ as an etchant.

9. The method of claim 1, wherein said second level of SAC openings is formed in said fourth silicon oxide layer, in said third silicon oxide layer, and in said second silicon oxide layer, via a selective, anisotropic RIE procedure, using $CHF_3$ as an etchant.

10. The method of claim 1, wherein said storage node structures, formed in said second level of SAC openings, are comprised of tungsten layer, obtained using LPCVD procedures, at a thickness between about 4000 to 12000 Angstroms.

11. The method of claim 1, wherein said fourth silicon oxide layer is selectively removed via wet etch procedures, using a dilute HF, or a buffered HF solution.

12. The method of claim 1, wherein said metal plug structures, located in openings in said fifth silicon oxide layer, are comprised of a tungsten layer, obtained via LPCVD procedures, at a thickness between about 4000 to 10000 Angstroms.

13. A method of simultaneously fabricating DRAM capacitor node structures, for a DRAM cell, and an interconnect structure, in a peripheral region of a DRAM chip, using self-aligned contact openings, self-aligned contact structures, and a dual damascene procedure, on a semiconductor substrate, comprising the steps of:

growing a silicon dioxide gate insulator layer;

forming silicon nitride capped, polycide gate structures, on said silicon dioxide gate insulator layer, with first silicon nitride spacers on the sides of the silicon nitride capped, polycide gate structures, in said DRAM cell region;

forming source/drain regions, in a region of said semiconductor substrate, not covered by said silicon nitride capped, polycide gate structures, located in said DRAM cell region;

forming a silicon nitride capped, polycide gate structure, on said silicon dioxide gate insulator layer, with first silicon nitride spacers on the sides of the silicon nitride capped, polycide gate structure, in said peripheral region;

forming an opening in the silicon nitride capping layer, located on said silicon nitride capped, polycide gate structure, in said peripheral region, exposing a portion of the top surface of a metal silicide layer, of the silicon nitride capped, polycide gate structure;

depositing a first silicon oxide layer;

forming first SAC openings in said first silicon oxide layer, in said DRAM cell region, exposing said source/drain regions, and exposing a portion of the top surface of said silicon nitride capped, polycide gate structures;

opening a contact hole in said first silicon oxide layer, exposing a first region of said semiconductor substrate, in said peripheral region;

depositing a conductive layer, completely filling first SAC openings, and completely filling said contact hole, in said first silicon oxide layer, in said peripheral region;

removing said conductive layer from the top surface of said first silicon oxide layer, creating SAC structures, in said SAC openings, in said DRAM cell region, and creating a conductive plug structure, in said contact hole, in said peripheral region;

depositing a second silicon oxide layer;

planarizing said second silicon oxide layer;

forming a first via hole in said second oxide layer, exposing a portion of the top surface of a SAC structure, to be used as a bit line SAC structure, and forming a second via hole in said second silicon oxide layer, exposing a portion of the top surface of said conductive plug structure;

depositing a first polysilicon layer, completely filling said first via hole, and completely filling said second via hole;

depositing a tungsten silicide layer, on underlying, said first polysilicon layer;

depositing a first silicon nitride layer, on said tungsten silicide layer;

patterning of said first silicon nitride layer, of said tungsten silicide layer, and of said first polysilicon layer, to create silicon nitride capped, polycide structures, with a first silicon nitride capped, polycide structure, connected to underlying, said bit line SAC structure, via polysilicon filled, first via hole, and with a second silicon nitride capped, polycide gate structure, connected to said conductive plug structure, via polysilicon filled, second via hole;

forming second silicon nitride spacers on the sides of said silicon nitride capped, polycide structures;

depositing a third silicon oxide layer;

planarizing of said third silicon oxide layer;

depositing a second silicon nitride layer;

patterning of said second silicon nitride layer, to create a silicon nitride hard mask, with a first set of openings, exposing a region of said third silicon oxide layer, overlying a second SAC structure, and a third SAC structure, to be used as storage node SAC structures, and with a second set of openings, in said silicon nitride hard mask, directly overlying said opening in the silicon nitride layer, of said silicon nitride capped, polycide gate structure, in said peripheral region, and directly overlying a second region of said semiconductor substrate, in said peripheral region;

depositing a fourth silicon oxide layer;

removing said fourth silicon oxide layer, exposed in openings in an overlying photoresist shape, and removal of said third silicon oxide layer, and of said second silicon oxide layer, exposed in said first set of openings in said silicon nitride hard mask, to create SAC storage node openings;

removal of said fourth silicon oxide layer, exposed in openings in said overlying photoresist shape, and removal of said third silicon oxide layer, of said second silicon oxide layer, and of said first silicon oxide layer, creating a lower interconnect opening, in said peripheral region;

depositing a first tungsten layer, completely filling said SAC storage node openings, and completely filling said lower interconnect opening;

removing said first tungsten layer from the top surface of said fourth silicon oxide layer, creating said SAC storage node structures, in said SAC storage node openings, and creating a lower interconnect structure, in said lower interconnect opening;

removing said fourth silicon oxide layer;

forming a capacitor dielectric layer, on said SAC storage node structures;

depositing a second polysilicon layer;

patterning of said second polysilicon layer to create a cell plate, for a DRAM capacitor structure, comprised of said cell plate, of said capacitor dielectric layer, and of said SAC storage node structures;

depositing a fifth silicon oxide layer;

planarizing said fifth silicon nitride layer;

opening a first via hole in said fifth silicon oxide layer, exposing said cell plate, of said DRAM capacitor structure, in said DRAM cell region, and opening a second via hole in said fifth silicon oxide layer, exposing the top surface of said lower interconnect structure, in said peripheral region;

opening a third via hole in said fifth silicon oxide layer, in said silicon nitride hard mask, in said third silicon oxide layer, and in the capping silicon nitride layer, of said second silicon nitride capped, polycide structure, exposing the tungsten silicide layer, of said second silicon nitride capped, polycide structure;

depositing a second tungsten layer, completely filling said first via hole, said second via hole, and said third via hole;

removing said second tungsten layer from the top surface of said fifth silicon oxide layer, creating tungsten plugs, in said first via hole, in said second via hole, and in said third via hole;

depositing an aluminum based metal layer; and patterning of said aluminum based metal layer to form: a first aluminum based interconnect structure, contacting said DRAM capacitor structure, via a tungsten plug, located in said first via hole; a second aluminum based interconnect structure, contacting said lower interconnect structure, via a tungsten plug, located in said second via hole; and a third aluminum based interconnect structure, contacting said second silicon nitride capped, polycide structure, via a tungsten plug, located in said third via hole.

14. The method of claim 13, wherein said silicon dioxide gate insulator layer is thermally grown, in an oxygen—steam ambient, to a thickness between about 50 to 200 Angstroms.

15. The method of claim 13, wherein said silicon nitride capped, polycide gate structures are comprised of an overlying silicon nitride layer, obtained via LPCVD or PECVD procedures, at a thickness between about 1000 to 2500 Angstroms, and an underlying polycide layer comprised of a tungsten silicide layer, obtained via LPCVD procedures, at a thickness between about 500 to 1500 Angstroms, and an underlying layer, of in situ doped polysilicon, obtained via LPCVD procedures, at a thickness between about 500 to 1500 Angstroms.

16. The method of claim 13, wherein said first SAC openings, are formed in said first silicon oxide layer, via a selective, anisotropic RIE procedure, using $CHF_3$ as an etchant.

17. The method of claim 13, wherein said conductive layer, used for said SAC structures, in said first SAC openings, is a polysilicon layer, obtained via LPCVD procedures, and in situ doped during deposition via the addition of arsine, or phosphine, to a silane ambient.

18. The method of claim 13, wherein said conductive layer, used for said SAC structures, in said first SAC openings, is a tungsten layer, with an underlying layer of titanium nitride, obtained via R.F. sputtering procedures.

19. The method of claim 13, wherein said silicon nitride capped, polycide structures are comprised of an overlying silicon nitride layer, obtained via LPCVD or PECVD procedures, at a thickness between about 1000 to 2500 Angstroms, and an underlying polycide layer, comprised of a tungsten silicide layer, obtained via LPCVD procedures, at a thickness between about 500 to 1500 Angstroms, and an underlying layer of in situ doped polysilicon, at a thickness between about 500 to 1500 Angstroms.

20. The method of claim 13, wherein said silicon nitride hard mask, is formed from said second silicon nitride layer, obtained via LPCVD or PECVD procedures, at a thickness between about 200 to 1000 Angstroms, and patterned to create said first set of openings, and said second set of openings, using an anisotropic RIE procedure, using $CHF_3$ as an etchant.

21. The method of claim 13, wherein said fourth silicon oxide layer is deposited using LPCVD or PECVD procedures, to a thickness between about 4000 to 10000 Angstroms.

22. The method of claim 13, wherein said SAC storage node structures are formed from said first tungsten layer, deposited using LPCVD or R.F. sputtering procedures, at a thickness between about 4000 to 12000 Angstroms.

23. The method of claim 13, wherein said fourth silicon oxide layer is selectively removed via wet etch procedures, using a dilute HF, or a buffered HF solution.

24. The method of claim 13, wherein said tungsten plugs are formed from said second tungsten layer, deposited using LPCVD or R.F. sputtering procedures, at a thickness between about 4000 to 10000 Angstroms.

* * * * *